(12) United States Patent
Prakash et al.

(10) Patent No.: US 11,468,950 B1
(45) Date of Patent: Oct. 11, 2022

(54) MEMORY PROGRAMMING WITH SELECTIVELY SKIPPED BITSCANS AND FEWER VERIFY PULSES FOR PERFORMANCE IMPROVEMENT

(71) Applicant: SanDisk Technologies LLC, Addison, TX (US)

(72) Inventors: Abhijith Prakash, Milpitas, CA (US); Anubhav Khandelwal, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 17/231,490

(22) Filed: Apr. 15, 2021

(51) Int. Cl.
| | |
|---|---|
| *G11C 16/04* | (2006.01) |
| *G11C 16/10* | (2006.01) |
| *G11C 16/34* | (2006.01) |
| *G11C 16/08* | (2006.01) |
| *G11C 11/56* | (2006.01) |
| *H01L 27/11565* | (2017.01) |
| *G11C 16/26* | (2006.01) |
| *H01L 27/11556* | (2017.01) |
| *H01L 27/11582* | (2017.01) |
| *H01L 27/11519* | (2017.01) |

(52) U.S. Cl.
CPC .......... *G11C 16/10* (2013.01); *G11C 11/5628* (2013.01); *G11C 11/5671* (2013.01); *G11C 16/0483* (2013.01); *G11C 16/08* (2013.01); *G11C 16/3459* (2013.01); *G11C 16/26* (2013.01); *H01L 27/11519* (2013.01); *H01L 27/11556* (2013.01); *H01L 27/11565* (2013.01); *H01L 27/11582* (2013.01)

(58) Field of Classification Search
CPC .................. G11C 16/0483; G11C 16/3454
USPC ........................................ 365/185.17, 185.22
See application file for complete search history.

(56) References Cited

U.S. PATENT DOCUMENTS

| | | | |
|---|---|---|---|
| 7,688,638 B2 | 3/2010 | Hemink | |
| 8,223,556 B2 | 7/2012 | Dutta et al. | |
| 8,787,093 B2 | 7/2014 | Komatsu | |
| 9,286,987 B1 * | 3/2016 | Dong | G11C 16/0466 |
| 9,842,655 B2 | 12/2017 | Kavalipurapu et al. | |
| 10,014,063 B2 | 7/2018 | Tseng et al. | |

* cited by examiner

*Primary Examiner* — Jason Lappas
(74) *Attorney, Agent, or Firm* — Dickinson Wright PLLC; Steven C. Hurles

(57) ABSTRACT

An apparatus that includes a word line with a plurality of memory cells that are able to be programmed to a plurality of data states is provided. The apparatus further includes a programming circuit. The programming circuit is configured to program the memory cells and count the number of verify pulses at a first verify voltage level that are performed during programming of the memory cells to a first programmed data state to determine a verify count. During programming to a second data state, the programming circuit applies a plurality of programming pulses at increasing voltage levels and a plurality of verify pulses at a second verify voltage level to the selected word line. During programming of the memory cells to the second programmed data state, the number of verify pulses is one fewer than the number of programming pulses and bitscan operations are skipped.

20 Claims, 25 Drawing Sheets

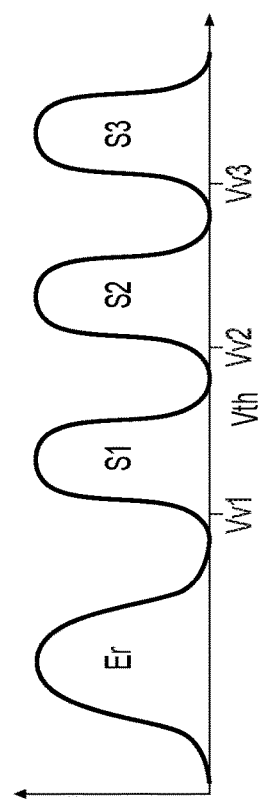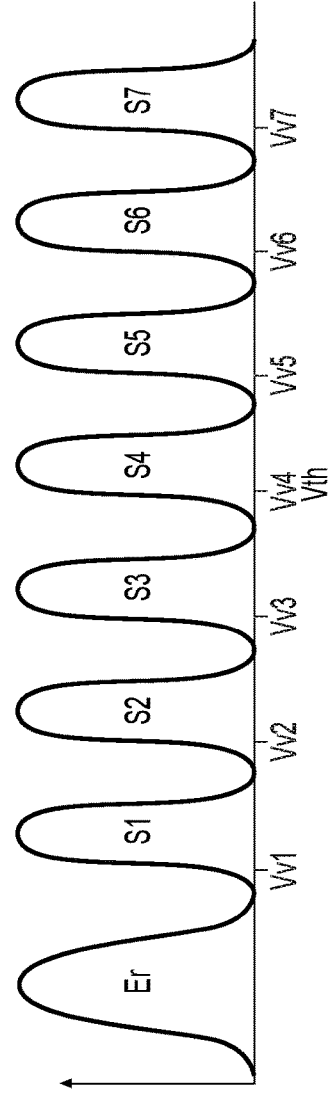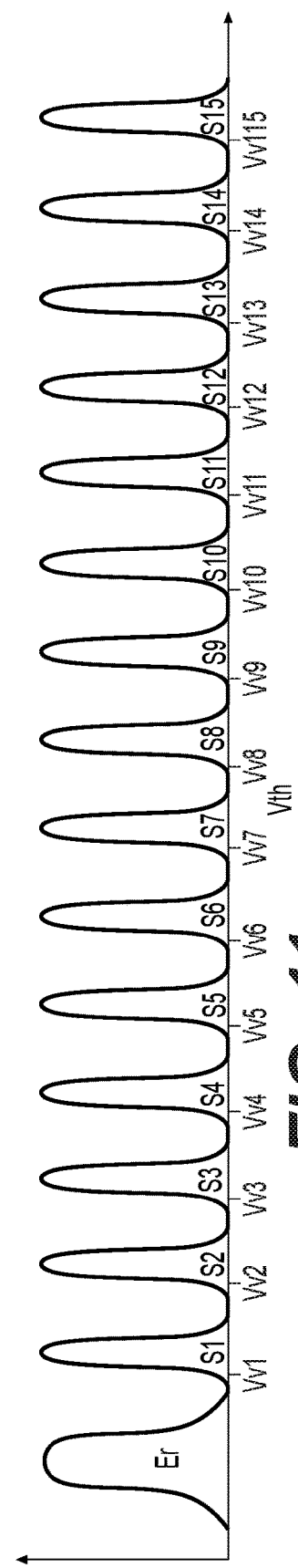

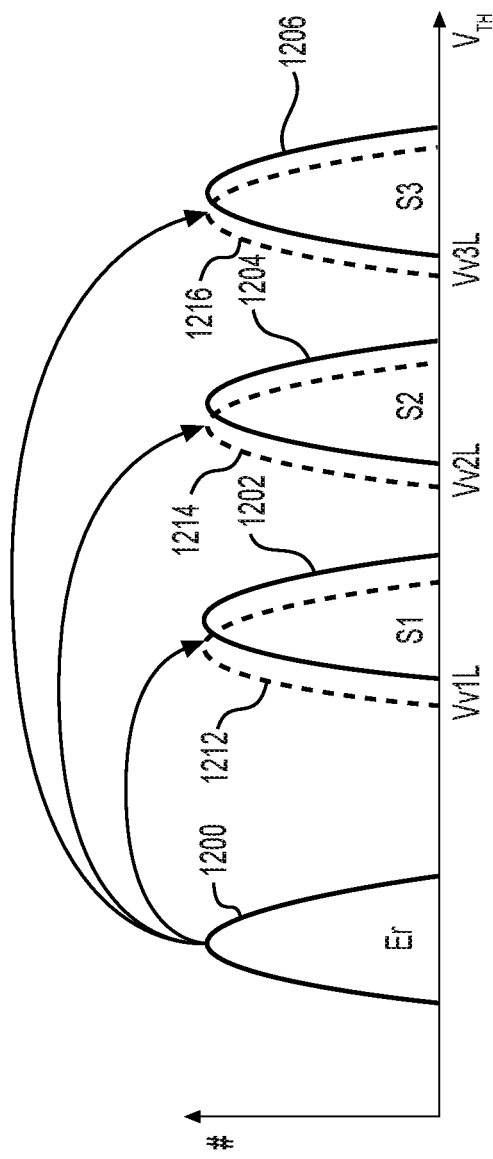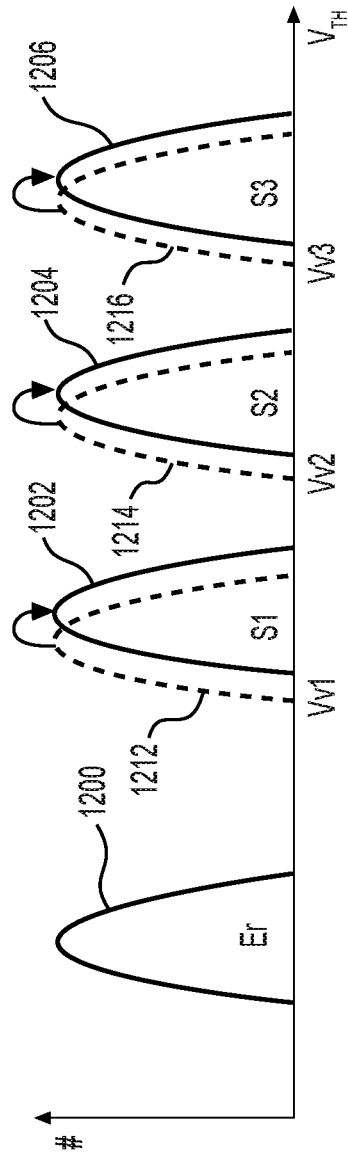

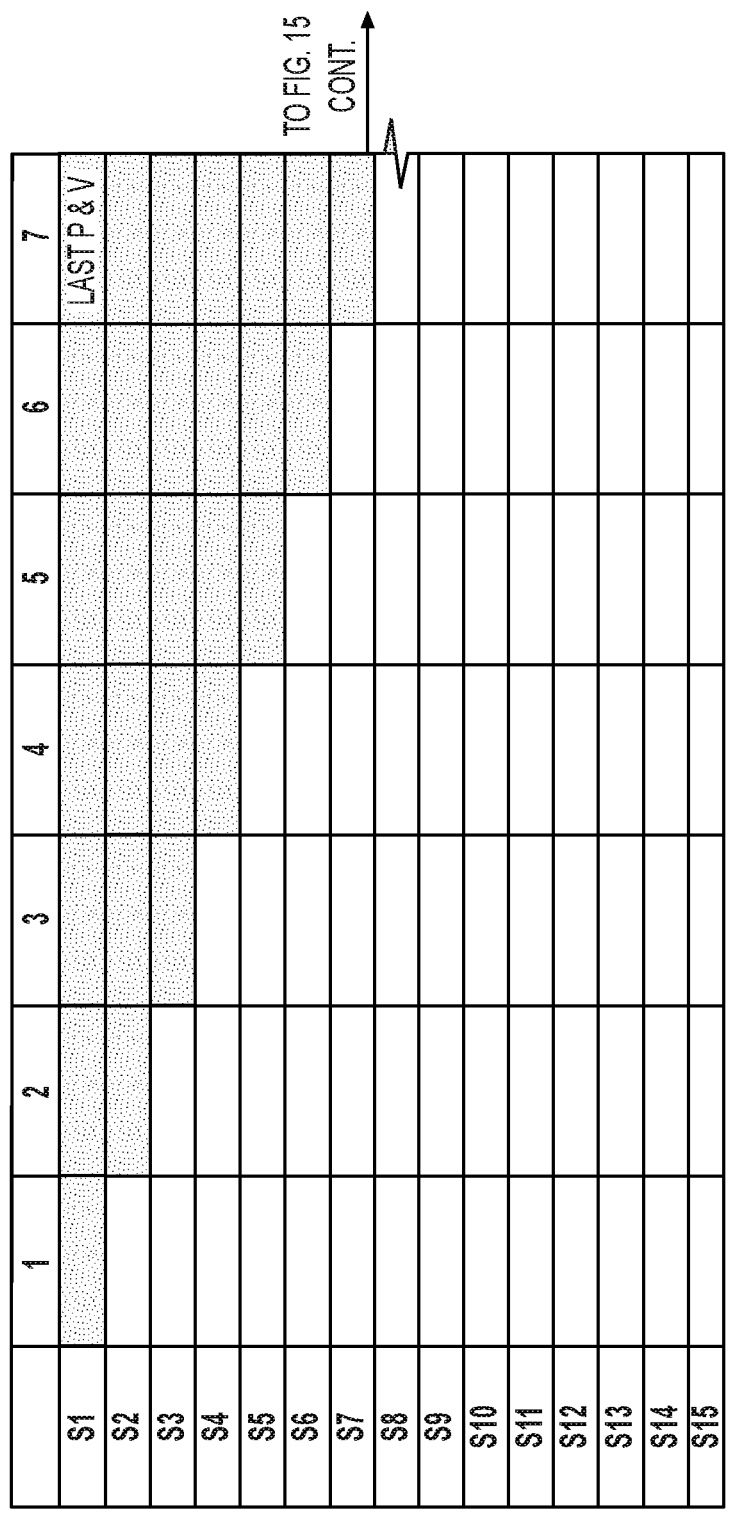

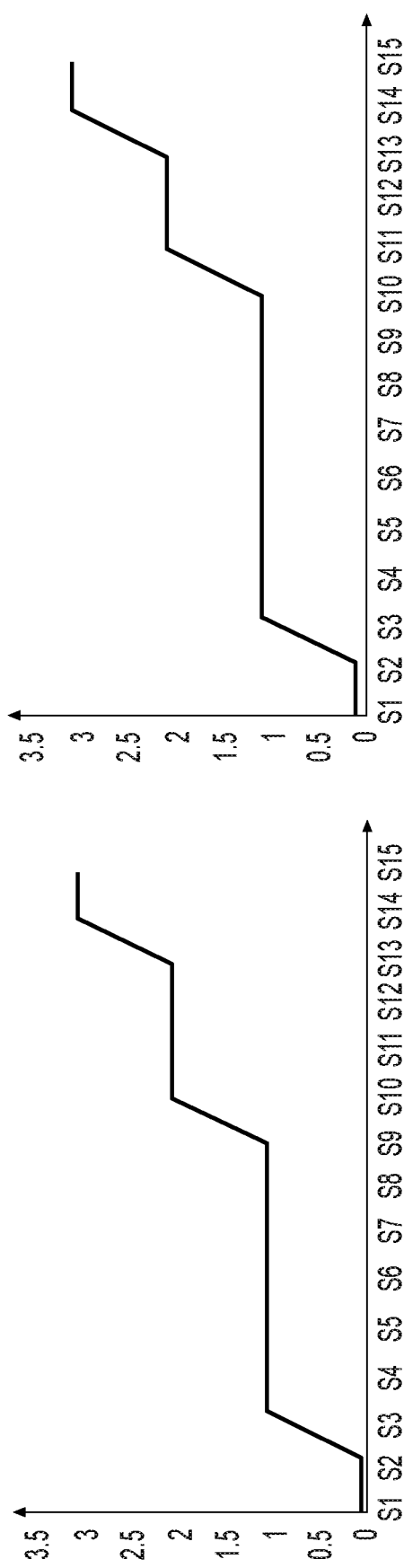
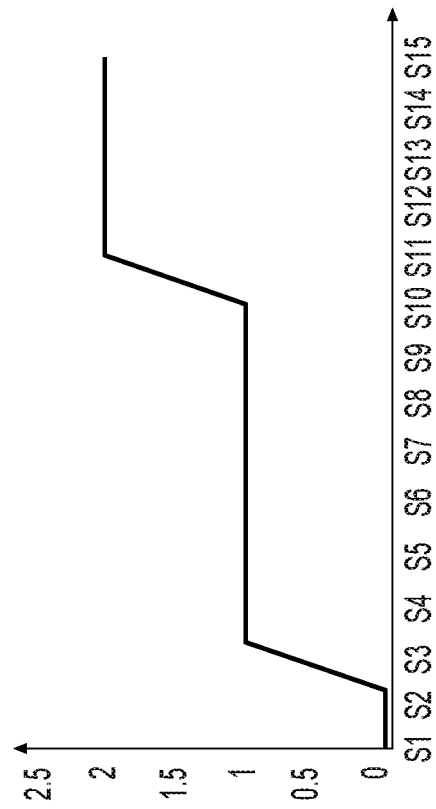
FIG. 19A
FIG. 19B
FIG. 19C

MEMORY PROGRAMMING WITH SELECTIVELY SKIPPED BITSCANS AND FEWER VERIFY PULSES FOR PERFORMANCE IMPROVEMENT

BACKGROUND

1. Field

The present technology relates to the operation of memory devices.

2. Related Art

Memory devices are typically provided as internal, semiconductor, integrated circuits in computers or other electronic devices. There are many different types of memory, including random-access memory (RAM), read only memory (ROM), dynamic random-access memory (DRAM), synchronous dynamic random-access memory (SDRAM), an electrically erasable programmable read-only memory (EEPROM), a flash memory, and/or the like. In an EEPROM or flash NAND array architecture, memory cells may be arranged in a matrix of rows and columns such that gates of each memory cell are coupled by rows to word lines. The memory cells may be arranged together in strings such that memory cells in a given string are coupled together in series, from source to drain, between a common source line and a common bit line.

Various techniques exist to program the memory cells to a plurality of data states, and there is a continuing need to improve the programming performance.

SUMMARY

The programming techniques of the present disclosure are provided to reduce programming time tprog by eliminating some verify pulses and selectively skipping bitscans from a programming operation.

An aspect of the present disclosure, a method of programming a memory apparatus is provided. The method includes the step of programming memory cells of a selected word line to a first programmed data state by conducting a plurality of programming loops until programming of the first programmed data state is completed. The programming loops include applying a programming pulse to the selected word line, applying a verify pulse at a first verify voltage level to the selected word line, and conducting a bitscan operation prior to the application of the programming pulse of a next subsequent programming loop. The method further includes determining a verify count being the number of verify pulses at the first verify voltage level performed to complete programming of the memory cells to the first programmed data state. The method proceeds with programming memory cells to a second programmed data state that is at a higher voltage threshold than the first programmed data state by applying a plurality of programming pulses at increasing voltage levels and a plurality of verify pulses at a second verify voltage level to the selected word line. During programming of the memory cells to the second programmed data state, the number of verify pulses at the second verify voltage level is one fewer than the number of programming pulses.

According to another aspect of the present disclosure, the number of programming pulses to complete programming of the memory cells to the second programmed data state is equal to the verify count and wherein the number of verify pulses at the second verify voltage level to complete programming of the memory cells to the second programmed data state is one fewer than the verify count.

According to yet another aspect of the present disclosure, a number of programming pulses to complete programming of the memory cells to the second programmed data state is equal to the verify count plus a predetermined offset associated with the second programmed data state, and the number of verify pulses at the second programmed data state is equal to the verify count plus the predetermined offset that is associated with the second programmed data state minus one.

According to still another aspect of the present disclosure, the method further includes the step of programming memory cells to a third programmed data state that is at a higher voltage than the second programmed data state by applying to the word line a number of programming pulses and a number of verify pulses at a third verify voltage level. The number of programming pulses is equal to the verify count plus a predetermined offset associated with the third programmed data state, and the number of verify pulses at the third verify voltage level that are performed during programming of the memory cells to the third programmed data state is equal to the verify count plus the predetermined offset that is associated with the third programmed data state minus one.

According to a further aspect of the present disclosure, the predetermined offsets associated with the second and third programmed data states are based on a bit ignore criteria.

According to yet a further aspect of the present disclosure, during programming of the memory cells to the second and third programmed data states, bitscan operations are skipped since the number of verify pulses are predetermined based on the verify count.

According to still a further aspect of the present disclosure, the first and second programmed data states are two of fifteen total programmed data states.

According to another aspect of the present disclosure, the programming steps are a portion of one pass of a multi-pass programming operation.

According to yet another aspect of the present disclosure, the programming steps are portions of both passes of a multi-pass programming operations.

Another aspect of the present disclosure is related to an apparatus that includes a word line with a plurality of memory cells that are able to be programmed to a plurality of data states. The apparatus further includes a programming circuit that is configured to apply a plurality of programming pulses and a plurality of verify pulses to the memory cells during a programming operation. During the programming operation, the programming circuit is configured to program memory cells of the word line to a first programmed data state by conducting a plurality of programming loops until programming of the first programmed data state is completed. The programming loops include applying a programming pulse to the word line, applying a verify pulse at a first verify voltage level to the word line, and conducting a bitscan operation prior to the application of the programming pulse of a next subsequent programming loop. The programming circuit is further configured to determine a verify count being the number of verify pulses at the first verify voltage level performed to complete programming of the memory cells to the first programmed data state. Once the verify count has been determined, the programming circuit is configured to program memory cells to a second programmed data state that is at a higher threshold than the first programmed data state by applying a plurality of programming pulses at increasing voltage levels and a plurality of verify pulses at a second verify voltage level to the word line. During programming of the memory cells to the second programmed data state, the number of verify pulses is one fewer than the number of programming pulses.

According to another aspect of the present disclosure, a number of programming pulses applied by the programming circuit to complete programming of the memory cells to the second programmed data state is equal to the verify count plus a predetermined offset associated with the second programmed data state and wherein the number of verify pulses at the second verify voltage level that are performed during programming of the memory cells to the second programmed data state is equal to the verify count plus the predetermined offset that is associated with the second programmed data state minus one.

According to yet another aspect of the present disclosure, each of the programmed data state includes a predetermined offset, and the predetermined offsets are based on a bit ignore criteria.

According to still another aspect of the present disclosure, during programming of the memory cells to the second programmed data state, bitscan operations are skipped since the number of verify pulses are predetermined based on the verify count.

According to a further aspect of the present disclosure, the first and second programmed data states are two of fifteen total programmed data states.

According to yet a further aspect of the present disclosure, the programming operation is a portion of one pass of a multi-pass programming operation that the programming circuit is configured to perform.

According to still a further aspect of the present disclosure, the programming operation is a portion of both passes of a multi-pass programming operation that the programming circuit is configured to perform.

Still another aspect of the present disclosure is related to a memory system that includes a word line with a plurality of memory cells that are able to be programmed to a plurality of data states. The memory system includes a programming circuit that is configured to apply a plurality of programming pulses and a plurality of verify pulses to the memory cells of a selected word line and to perform bitscan operations during a programming operation. During the programming operation, the programming circuit is configured to program memory cells to a first programmed data state by conducting a plurality of programming loops until programming of the first data state is completed. The plurality of programming loops include programming pulses at sequentially increasing voltages and verify pulses at a first verify level and bitscan operations that are conducted after the verify pulses and before the programming pulse of a following programming loop. The programming circuit is further configured to determine a verify count being the number of verify pulses at the first verify voltage level performed to complete programming of the memory cells to the first programmed data state and to program memory cells to a second programmed data state that is at a higher voltage threshold than the first programmed data state by conducting a plurality of programming loops. The number of programming loops is no more than the verify count plus a predetermined offset, and a last one of the programming loops does not include a verify pulse. Also, program loops for all the data states programmed after the first programmed data state do not include bitscan operations.

According to another aspect of the present disclosure, each of the programmed data states includes a predetermined offset, and the predetermined offsets are based on a bit ignore criteria.

According to yet another aspect of the present disclosure, the programming operation is a portion of one pass of a multi-pass programming operation that the programming circuit is configured to perform.

According to still another aspect of the present disclosure, the programming operation is a portion of both passes of a multi-pass programming operation that the programming circuit is configured to perform.

BRIEF DESCRIPTION OF THE DRAWINGS

FIG. 9 illustrates the Vth distributions of the data states in a MLC memory system;

FIG. 10 illustrates the Vth distributions of the data states in a TLC memory system;

FIG. 11 illustrates the Vth distributions of the data states in a QLC memory system;

FIG. 12A depicts one embodiment of a first pass of the two-pass programming technique;

FIG. 12B depicts one embodiment of a second pass of the two-pass programming technique;

FIG. 19A depicts a chart showing the number of offset loops for data states S1-S15 according to one embodiment;

FIG. 19B depicts a chart showing the number of offset loops for data states S1-S15 according another embodiment;

FIG. 19C depicts a chart showing the number of offset loops for data states S1-S15 according to yet another embodiment.

DETAILED DESCRIPTION

Figure 1A:
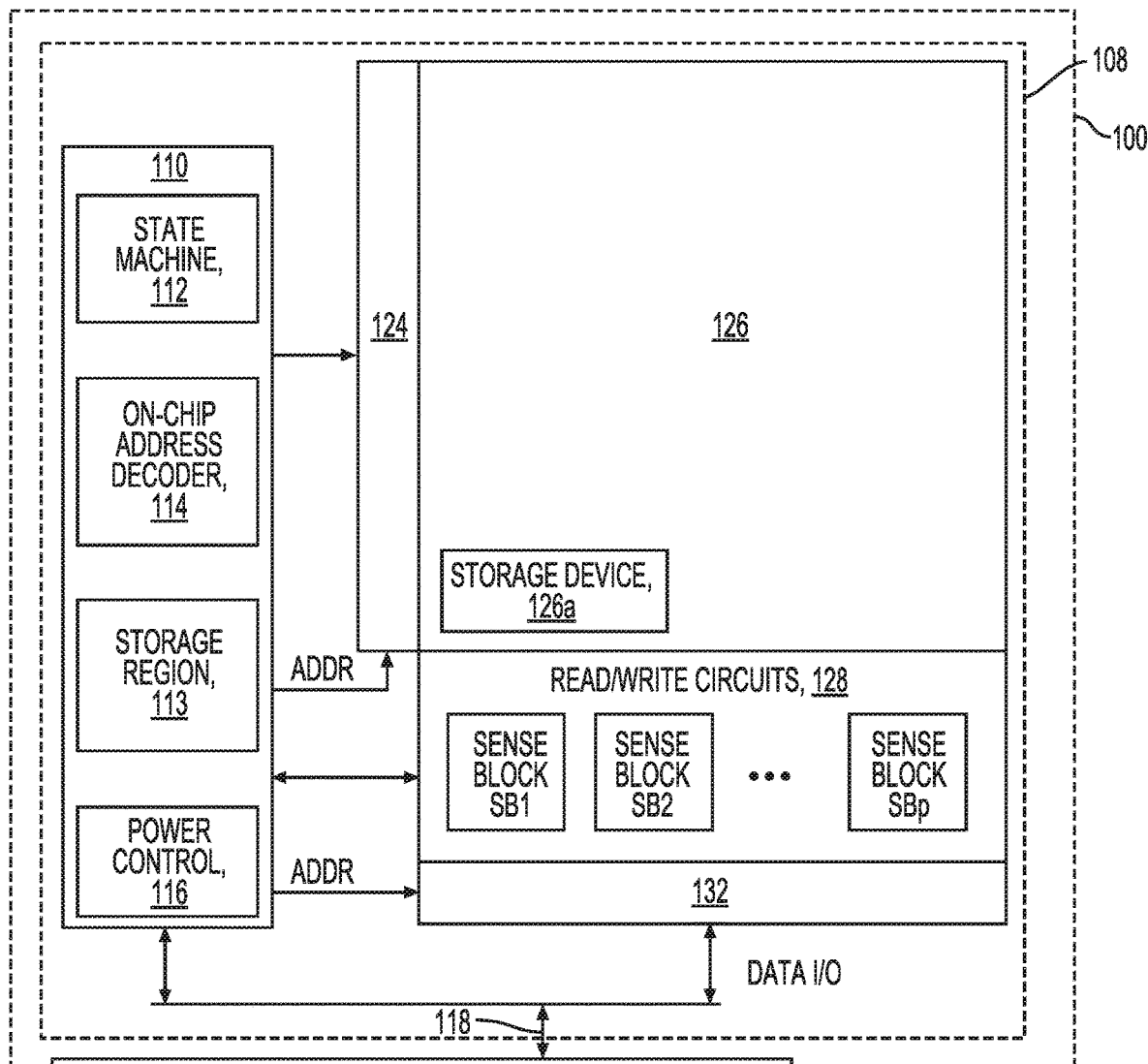
FIG. 1A is a block diagram of an example memory device.

Techniques are provided for programming a memory device. A corresponding memory device with corresponding programming circuits are also provided.

A programming operation for a group of memory cells typically involves providing the memory cells in an erased state and then applying a series of programming pulses to the memory cells. Each programming pulse is provided in a program loop, also referred to as a program-verify iteration. For example, the programming pulse may be applied to a word line that is connected to control gates of the memory cells. In one approach, incremental step pulse programming is performed, in which the programming pulse amplitude is increased by a step size in each program loop. Verify operations may be performed after each programming pulse to determine whether the memory cells have completed programming, and bitscan operations may be performed separately after verify operation and before the next programming pulse, or may be performed simultaneous to the subsequent programming pulse to count the number of memory cells that have not completed programming. When programming has completed for a memory cell, the memory cell can be locked out (inhibited) from further programming while programming continues for other memory cells in subsequent program loops.

Each memory cell may be associated with a memory state according to write data in a program command. As used herein, a "memory state" or "data state" is a detectable characteristic of a memory cell (e.g., a threshold voltage of a NAND memory cell, a resistance of a ReRAM memory cell, a magnetization state of a magnetoresistive random access memory, etc.) that may be used to represent a data value, such as a binary data value. As used herein, the detectable characteristic of a memory cell used to represent a data value is referred to as a "programming characteristic." Based on write data in a program command, a memory cell will either remain in the erased state or be programmed to a memory state (a programmed data state) different from the erased state.

As shown in FIG. 9, in a two bit-per cell memory device (MLC), there are four memory states including the erased state and three programmed data states (S1, S2, and S3). As shown in FIG. 10, in a three bit-per cell memory device (TLC), there are eight memory states including the erased state and seven programmed data states (S1, S2, S3, S4, S5, S6, and S7). As shown in FIG. 11, in a four bit-per cell memory device (QLC), there are sixteen memory states including the erased state and fifteen programmed data states (S1, S2, S3, S4, S5, S6, S7, S8, S9, S10, S11, S12, S13, S14, and S15).

When a program command is issued, the write data is stored in data latches associated with the memory cells. For example, in an MLC memory device, each memory cell is associated with two data latches that store the two-bit write data; in a TLC memory device, each memory cell is associated with three data latches that store the three-bit write data for the memory cell; and in a QLC memory device, each memory cell is associated with four data latches that store the four-bit write data for the memory cell.

During programming, the data latches of a memory cell can be read to determine the data state to which the memory cell is to be programmed. For NAND memory cells, each programmed memory state is associated with a verify voltage. A NAND memory cell with a given data state is considered to have completed programming when a sensing operation determines the threshold voltage (Vth) of the memory cell is above the associated verify voltage. A sensing operation can determine whether a memory cell has a Vth above the associated verify voltage by applying the associated verify voltage to the control gate and sensing a current through the memory cell. If the current is relatively high, this indicates the memory cell is in a conductive state, such that the Vth is less than the control gate voltage. If the current is relatively low, this indicates the memory cell is in a non-conductive state, such that the Vth is above the control gate voltage.

In addition to the verify operations described above, a bitscan operation may be performed to determine when programming is complete for a group of memory cells. As used herein, a "bitscan" is an operation that counts the number of memory cells whose programming characteristic has not shifted above a particular verify voltage level for a particular memory state. For NAND memory cells, a bitscan is an operation that counts a number of memory cells whose threshold voltage has not shifted above a particular verify level for a particular memory state. For example, a state S1 bitscan is a count of a number of data state S1 memory cells whose threshold voltages has not shifted above a verify voltage level for data state S1 (see Vv1 in FIGS. 9-11). Likewise a state S2 bitscan is a count for a number of data state S2 memory cells whose threshold voltage has not shifted above a verify voltage for data state S2 (see Vv2 in FIGS. 9-11), and so on. Programming of memory cells for a particular data state may be considered complete if the bitscan count is less than a predetermined value (bit ignore criteria). In some embodiments, the bit ignore criteria may set for memory device as a whole or may be set for each individual word line. Thus, programming of memory cells to a particular data state may be considered complete even if all of those memory cells do not have threshold voltages that have shifted above a verify voltage level for the data state as long as the number of "failing" memory cells is less than the bit ignore criteria.

Bitscan calculations typically are performed based on results of verify operations for a particular programming iteration. In particular, following the application of a programming pulse, verify operations may be performed for one or more data states, and then results of the verify operations may be used to calculate the bitscan for a particular data state.

In some memory techniques, the bitscan operation may occur after the verify operation and prior to the application of the next programming pulse of the series of programming pulses. In other words, following the application of one or more verify pulses in one program loop, the bitscan operation (where the number of "failing" memory cells are counted) occurs, and then either after the bitscan operation is completed or while the bitscan operation is ongoing, the next programming pulse, which has an incrementally increased programming voltage, is applied.

The following disclosure describes techniques for reducing programming time by skipping certain verify and bitscan operations, namely, the verify operations following the last programming pulses required to complete programming of memory cells to some data states. Bitscan operations are skipped for all the programming pulses for all the data states except the first programmed data state. Various other features and benefits are also described below.

FIG. 1A is a block diagram of an example memory device. The memory device 100 may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks SB1, SB2, . . . SBp (sensing circuitry) and allow a page of memory cells to be read or programmed in parallel. Typically, a controller 122 is included in the same memory device 100 (e.g., a removable storage card) as the one or more memory die 108. Commands and data are transferred between the host 140 and controller 122 via a data bus 120, and between the controller and the one or more memory die 108 via lines 118.

The memory structure 126 can be two-dimensional or three-dimensional. The memory structure 126 may comprise one or more array of memory cells including a three-dimensional array. The memory structure 126 may comprise a monolithic three-dimensional memory structure in which multiple memory levels are formed above (and not in) a single substrate, such as a wafer, with no intervening substrates. The memory structure 126 may comprise any type of non-volatile memory that is monolithically formed in one or more physical levels of arrays of memory cells having an active area disposed above a silicon substrate. The memory structure 126 may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations.

A storage region 113 may, for example, be provided for programming parameters. The programming parameters may include a program voltage, a program voltage bias, position parameters indicating positions of memory cells, contact line connector thickness parameters, a verify voltage, and/or the like. The position parameters may indicate a position of a memory cell within the entire array of NAND strings, a position of a memory cell as being within a particular NAND string group, a position of a memory cell on a particular plane, and/or the like. The contact line connector thickness parameters may indicate a thickness of a contact line connector, a substrate or material that the contact line connector is comprised of, and/or the like.

The on-chip address decoder 114 provides an address interface between that used by the host or a memory controller to the hardware address used by the decoders 124 and 132. The power control module 116 controls the power and voltages supplied to the word lines and bit lines during memory operations. It can include drivers for word lines, SGS and SGD transistors, and source lines. The sense blocks can include bit line drivers, in one approach. An SGS transistor is a select gate transistor at a source end of a NAND string, and an SGD transistor is a select gate transistor at a drain end of a NAND string.

In some embodiments, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SBb, SB2, . . . , SBp, read/write circuits 128, controller 122, and so forth.

The control circuits can include a programming circuit configured to perform a program and verify operation for one set of memory cells, wherein the one set of memory cells comprises memory cells assigned to represent one data state among a plurality of data states and memory cells assigned to represent another data state among the plurality of data states; the program and verify operation comprising a plurality of program and verify iterations; and in each program and verify iteration, the programming circuit performs programming for the one word line after which the programming circuit applies a verification signal to the one word line. The control circuits can also include a counting circuit configured to obtain a count of memory cells which pass a verify test for the one data state. The control circuits can also include a determination circuit configured to determine, based on an amount by which the count exceeds a threshold, a particular program and verify iteration among the plurality of program and verify iterations in which to perform a verify test for another data state for the memory cells assigned to represent another data state.

Figure 1B:
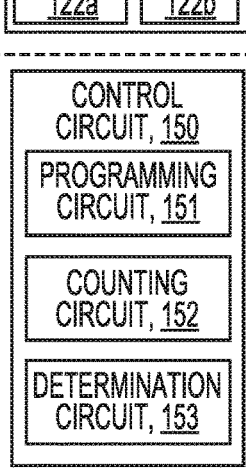
FIG. 1B is a block diagram of an example control circuit.

For example, FIG. 1B is a block diagram of an example control circuit 150 which comprises a programming circuit 151, a counting circuit 152, and a determination circuit 153.

The off-chip controller 122 may comprise a processor 122c, storage devices (memory) such as ROM 122a and RAM 122b and an error-correction code (ECC) engine 245. The ECC engine can correct a number of read errors which are caused when the upper tail of a Vth distribution becomes too high. However, uncorrectable errors may exist in some cases. The techniques provided herein reduce the likelihood of uncorrectable errors.

The storage device(s) 122a, 122b comprise, code such as a set of instructions, and the processor 122c is operable to execute the set of instructions to provide the functionality described herein. Alternately or additionally, the processor 122c can access code from a storage device 126a of the memory structure 126, such as a reserved area of memory cells in one or more word lines. For example, code can be used by the controller 122 to access the memory structure 126 such as for programming, read and erase operations. The code can include boot code and control code (e.g., set of instructions). The boot code is software that initializes the controller 122 during a booting or startup process and enables the controller 122 to access the memory structure 126. The code can be used by the controller 122 to control one or more memory structures 126. Upon being powered up, the processor 122c fetches the boot code from the ROM 122a or storage device 126a for execution, and the boot code initializes the system components and loads the control code into the RAM 122*b*. Once the control code is loaded into the RAM 122*b*, it is executed by the processor 122*c*. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below and provide the voltage waveforms including those discussed further below.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple memory strings in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured. The semiconductor memory elements located within and/or over a substrate may be arranged in two or three dimensions, such as a two-dimensional memory structure or a three-dimensional memory structure.

In a two-dimensional memory structure, the semiconductor memory elements are arranged in a single plane or a single memory device level. Typically, in a two-dimensional memory structure, memory elements are arranged in a plane (e.g., in an x-y direction plane) which extends substantially parallel to a major surface of a substrate that supports the memory elements. The substrate may be a wafer over or in which the layer of the memory elements is formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (i.e., in the x, y and z directions, where the z-direction is substantially perpendicular and the x- and y-directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in the y direction) with each column having multiple memory elements. The columns may be arranged in a two-dimensional configuration, e.g., in an x-y plane, resulting in a three-dimensional arrangement of memory elements with elements on multiple vertically stacked memory planes. Other configurations of memory elements in three dimensions can also constitute a three-dimensional memory array.

By way of non-limiting example, in a three-dimensional array of NAND strings, the memory elements may be coupled together to form a NAND string within a single horizontal (e.g., x-y) memory device level. Alternatively, the memory elements may be coupled together to form a vertical NAND string that traverses across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

Typically, in a monolithic three-dimensional memory array, one or more memory device levels are formed above a single substrate. Optionally, the monolithic three-dimensional memory array may also have one or more memory layers at least partially within the single substrate. As a non-limiting example, the substrate may include a semiconductor such as silicon. In a monolithic three-dimensional array, the layers constituting each memory device level of the array are typically formed on the layers of the underlying memory device levels of the array. However, layers of adjacent memory device levels of a monolithic three-dimensional memory array may be shared or have intervening layers between memory device levels.

Then again, two-dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three-dimensional memory arrays. Further, multiple two-dimensional memory arrays or three-dimensional memory arrays (monolithic or non-monolithic) may be formed on separate chips and then packaged together to form a stacked-chip memory device.

Figure 2:
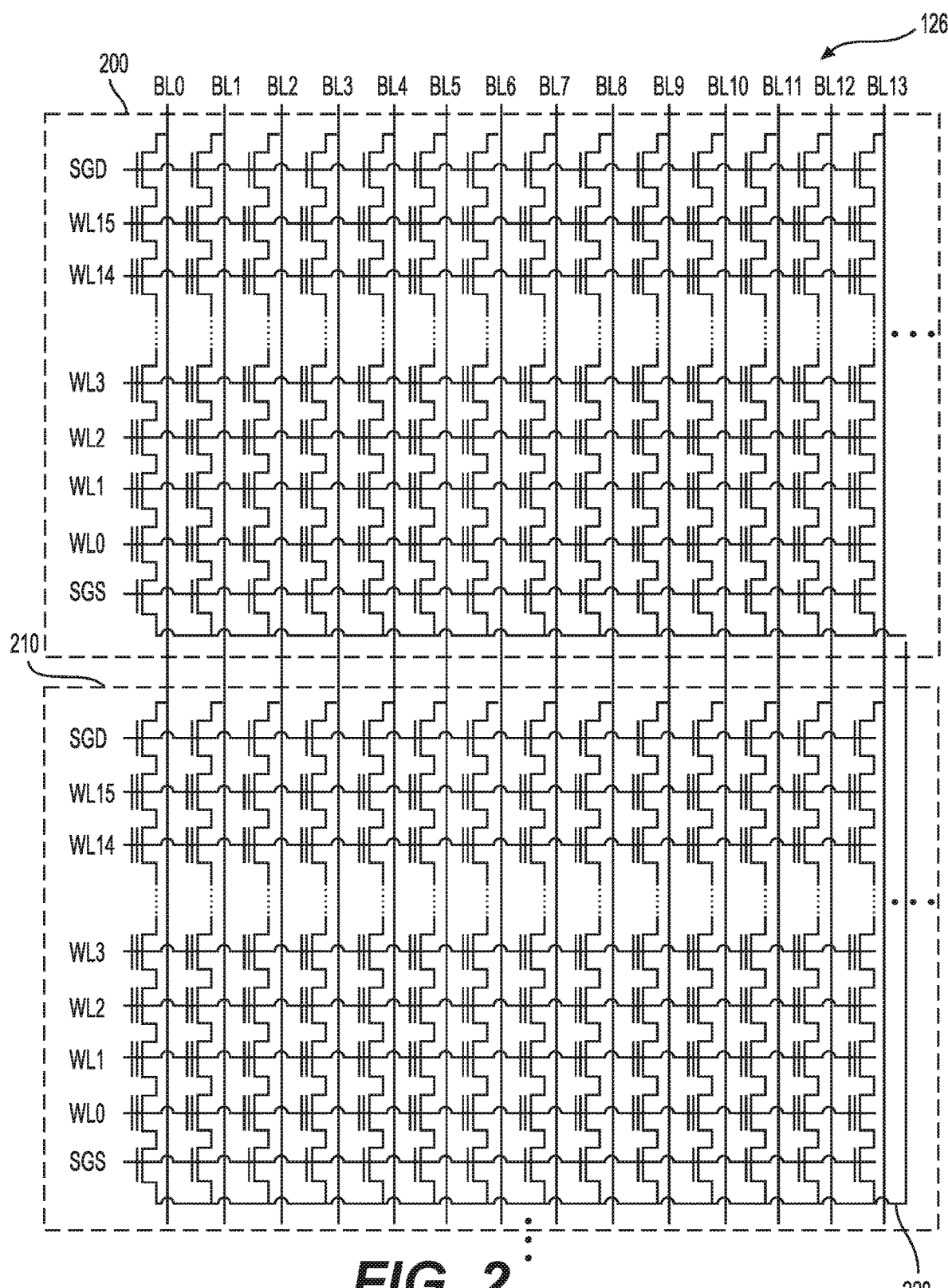
FIG. 2 depicts blocks of memory cells in an example two-dimensional configuration of the memory array of FIG. 1A.

FIG. 2 illustrates schematic views of three types of memory architectures utilizing staggered memory strings. For example, reference number 201 shows a schematic view of a first example memory architecture, reference number 203 shows a schematic view of a second example memory architecture, and reference number 205 shows a schematic view of a third example memory architecture. In some embodiments, as shown, the memory architecture may include an array of staggered NAND strings.

FIG. 2 illustrates blocks 200, 210 of memory cells in an example two-dimensional configuration of the memory array 126 of FIG. 1. The memory array 126 can include many such blocks 200, 210. Each example block 200, 210 includes a number of NAND strings and respective bit lines, e.g., BL0, BL1, . . . which are shared among the blocks. Each NAND string is connected at one end to a drain-side select gate (SGD), and the control gates of the drain select gates are connected via a common SGD line. The NAND strings are connected at their other end to a source-side select gate (SGS) which, in turn, is connected to a common source line 220. Sixteen word lines, for example, WL0-WL15, extend between the SGSs and the SGDs. In some cases, dummy word lines, which contain no user data, can also be used in the memory array adjacent to the select gate transistors. Such dummy word lines can shield the edge data word line from certain edge effects.

Figure 3A:
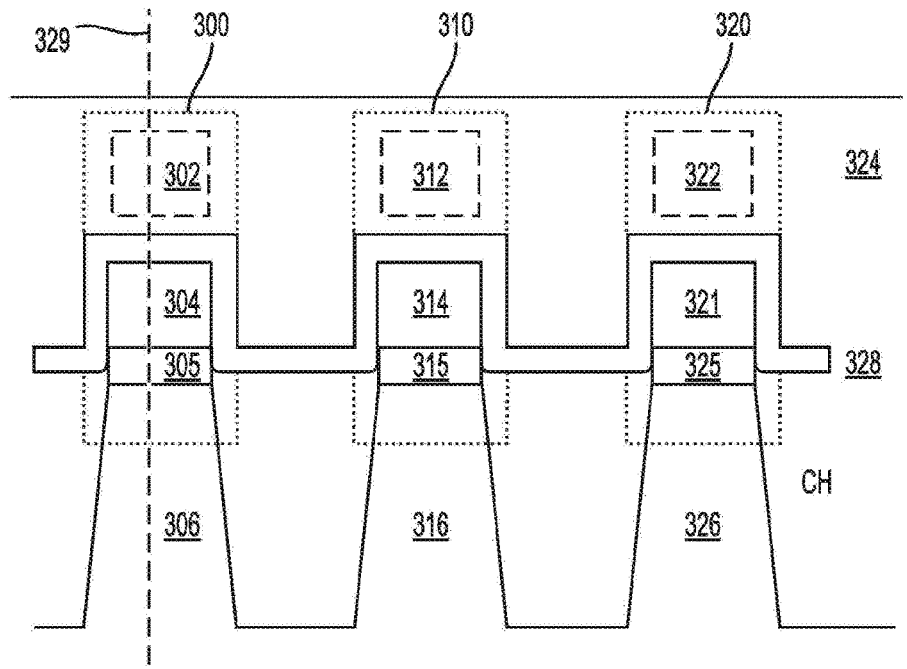
FIG. 3A and FIG. 3B depict cross-sectional views of example floating gate memory cells in NAND strings.
Figure 3B:
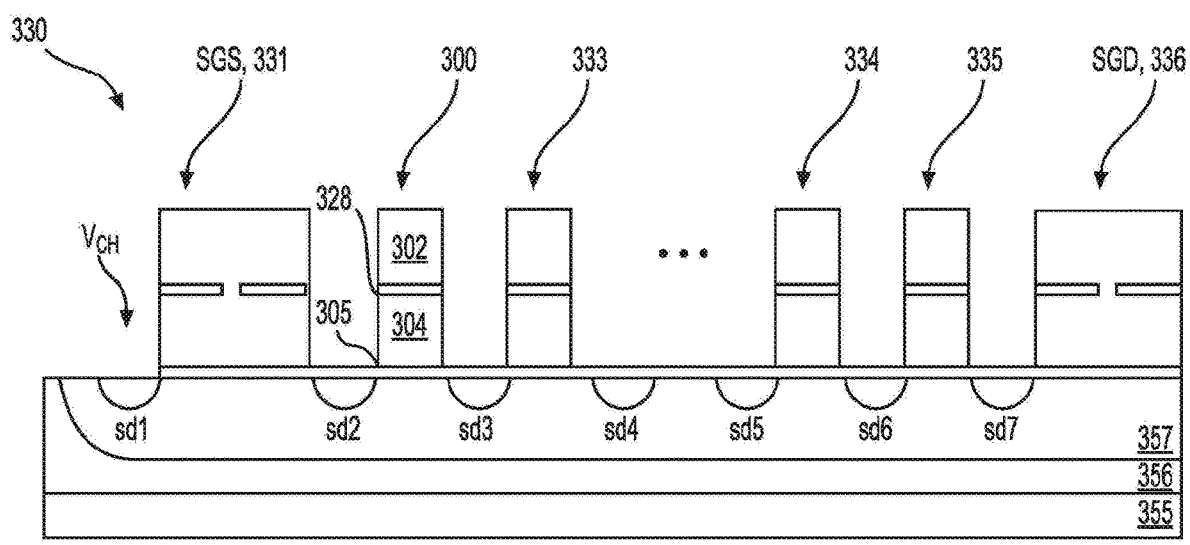

One type of non-volatile memory which may be provided in the memory array is a floating gate memory, such as of the type shown in FIGS. 3A and 3B. However, other types of non-volatile memory can also be used. As discussed in further detail below, in another example shown in FIGS. 4A and 4B, a charge-trapping memory cell uses a non-conductive dielectric material in place of a conductive floating gate to store charge in a non-volatile manner. A triple layer dielectric formed of silicon oxide, silicon nitride and silicon oxide ("ONO") is sandwiched between a conductive control gate and a surface of a semi-conductive substrate above the memory cell channel. The cell is programmed by injecting electrons from the cell channel into the nitride, where they are trapped and stored in a limited region. This stored charge then changes the threshold voltage of a portion of the channel of the cell in a manner that is detectable. The cell is erased by injecting hot holes into the nitride. A similar cell can be provided in a split-gate configuration where a doped polysilicon gate extends over a portion of the memory cell channel to form a separate select transistor.

In another approach, NROM cells are used. Two bits, for example, are stored in each NROM cell, where an ONO dielectric layer extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. Other types of non-volatile memory are also known.

FIG. 3A illustrates a cross-sectional view of example floating gate memory cells 300, 310, 320 in NAND strings. In this figure, a bit line or NAND string direction goes into the page, and a word line direction goes from left to right. As an example, word line 324 extends across NAND strings which include respective channel regions 306, 316 and 326. The memory cell 300 includes a control gate 302, a floating gate 304, a tunnel oxide layer 305 and the channel region 306. The memory cell 310 includes a control gate 312, a floating gate 314, a tunnel oxide layer 315 and the channel region 316. The memory cell 320 includes a control gate 322, a floating gate 321, a tunnel oxide layer 325 and the channel region 326. Each memory cell 300, 310, 320 is in a different respective NAND string. An inter-poly dielectric (IPD) layer 328 is also illustrated. The control gates 302, 312, 322 are portions of the word line. A cross-sectional view along contact line connector 329 is provided in FIG. 3B.

The control gate 302, 312, 322 wraps around the floating gate 304, 314, 321, increasing the surface contact area between the control gate 302, 312, 322 and floating gate 304, 314, 321. This results in higher IPD capacitance, leading to a higher coupling ratio which makes programming and erase easier. However, as NAND memory devices are scaled down, the spacing between neighboring cells 300, 310, 320 becomes smaller so there is almost no space for the control gate 302, 312, 322 and the IPD layer 328 between two adjacent floating gates 302, 312, 322.

Figure 4A:
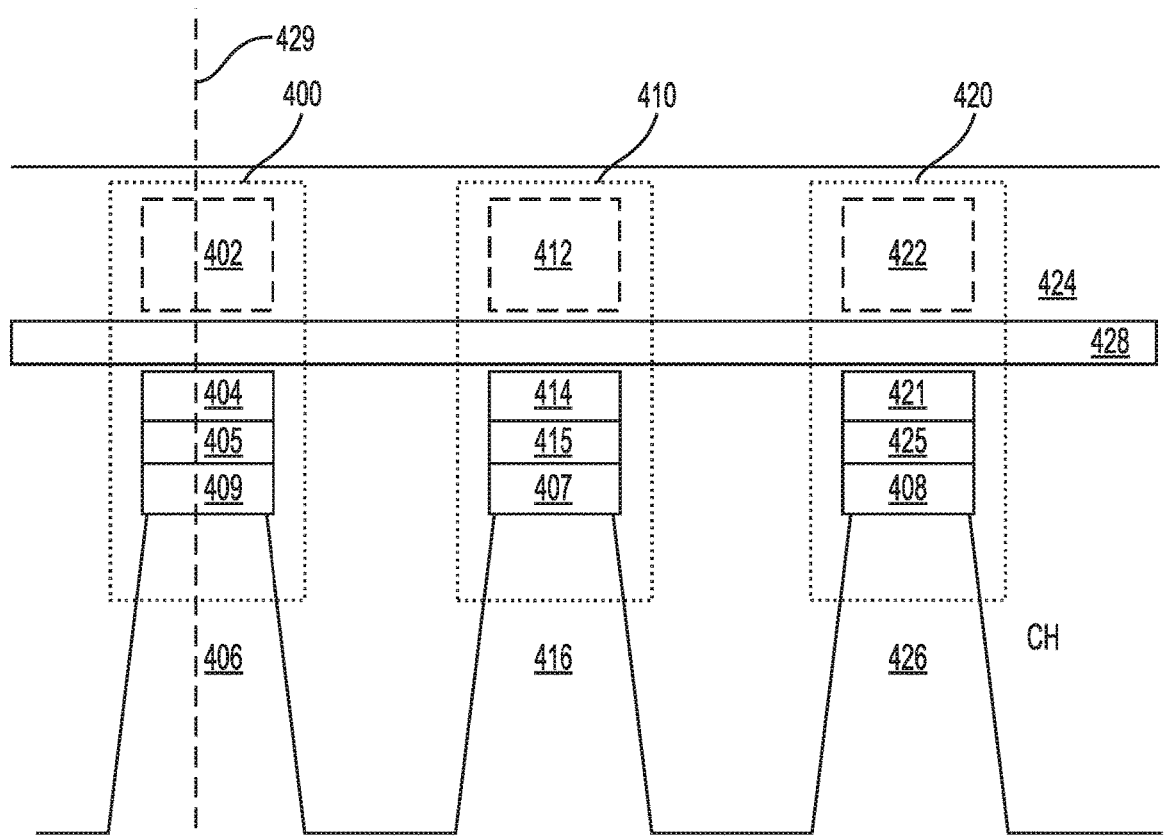
FIG. 4A and FIG. 4B depict cross-sectional views of example charge-trapping memory cells in NAND strings.
Figure 4B:
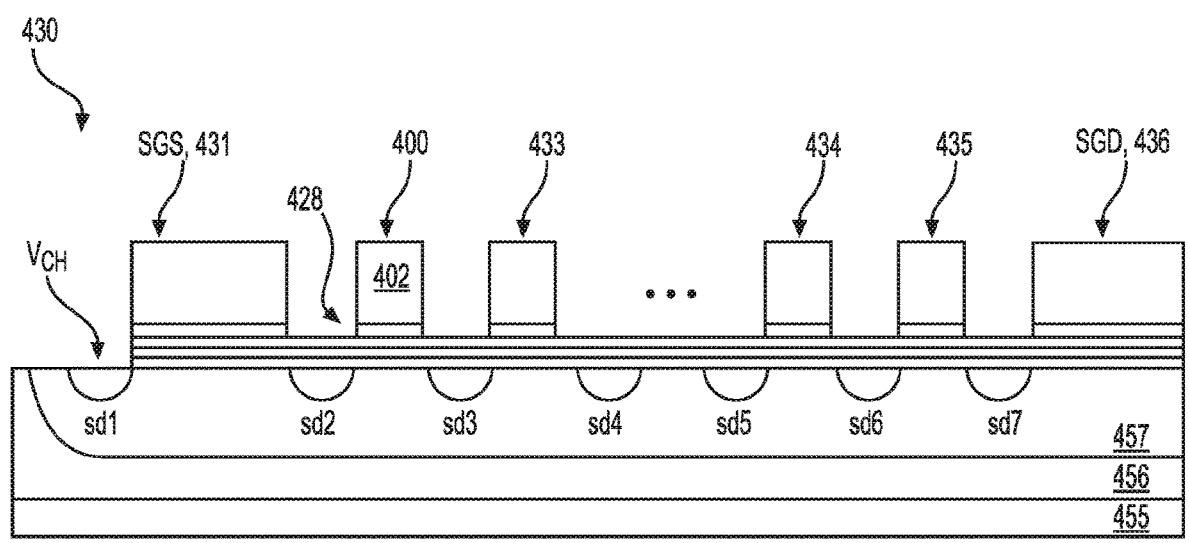

As an alternative, as shown in FIGS. 4A and 4B, the flat or planar memory cell 400, 410, 420 has been developed in which the control gate 402, 412, 422 is flat or planar; that is, it does not wrap around the floating gate and its only contact with the charge storage layer 428 is from above it. In this case, there is no advantage in having a tall floating gate. Instead, the floating gate is made much thinner. Further, the floating gate can be used to store charge, or a thin charge trap layer can be used to trap charge. This approach can avoid the issue of ballistic electron transport, where an electron can travel through the floating gate after tunneling through the tunnel oxide during programming.

FIG. 4A depicts a cross-sectional view of example charge-trapping memory cells 400, 410, 420 in NAND strings. The view is in a word line direction of memory cells 400, 410, 420 comprising a flat control gate and charge-trapping regions as a two-dimensional example of memory cells 400, 410, 420 in the memory cell array 126 of FIG. 1. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line 424 extends across NAND strings which include respective channel regions 406, 416, 426. Portions of the word line provide control gates 402, 412, 422. Below the word line is an IPD layer 428, charge-trapping layers 404, 414, 421, polysilicon layers 405, 415, 425, and tunneling layers 409, 407, 408. Each charge-trapping layer 404, 414, 421 extends continuously in a respective NAND string. The flat configuration of the control gate can be made thinner than a floating gate. Additionally, the memory cells can be placed closer together.

FIG. 4B illustrates a cross-sectional view of the structure of FIG. 4A along contact line connector 429. The NAND string 430 includes an SGS transistor 431, example memory cells 400, 433, . . . 435, and an SGD transistor 436.

Passageways in the IPD layer 428 in the SGS and SGD transistors 431, 436 allow the control gate layers 402 and floating gate layers to communicate. The control gate 402 and floating gate layers may be polysilicon and the tunnel oxide layer may be silicon oxide, for instance. The IPD layer 428 can be a stack of nitrides (N) and oxides (O) such as in a N—O—N—O—N configuration.

The NAND string may be formed on a substrate which comprises a p-type substrate region 455, an n-type well 456 and a p-type well 457. N-type source/drain diffusion regions sd1, sd2, sd3, sd4, sd5, sd6 and sd7 are formed in the p-type well. A channel voltage, Vch, may be applied directly to the channel region of the substrate.

Figure 5:
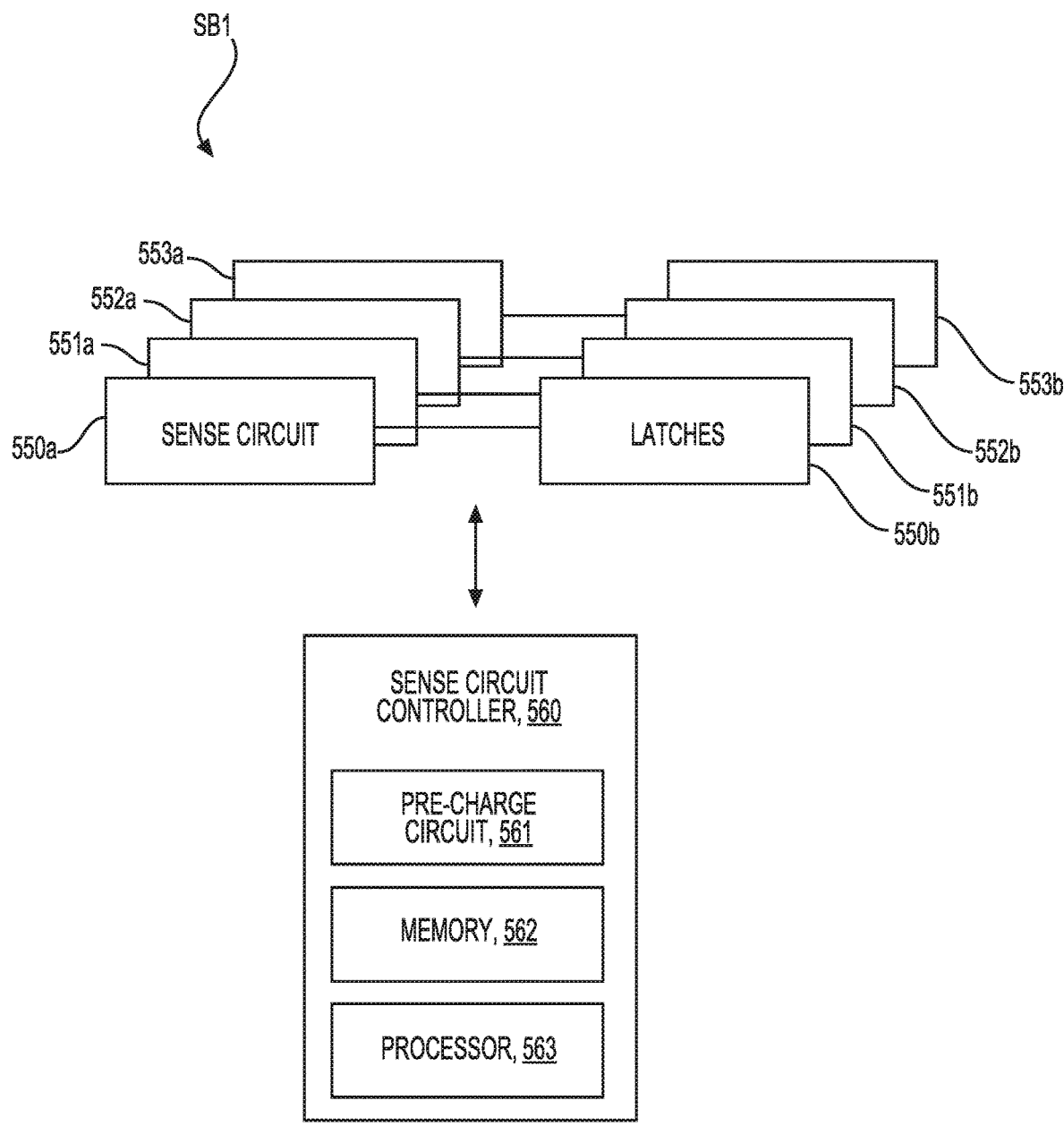
FIG. 5 depicts an example block diagram of the sense block SB1 of FIG. 1.

FIG. 5 illustrates an example block diagram of the sense block SB1 of FIG. 1. In one approach, a sense block comprises multiple sense circuits. Each sense circuit is associated with data latches. For example, the example sense circuits 550a, 551a, 552a, and 553a are associated with the data latches 550b, 551b, 552b, and 553b, respectively. In one approach, different subsets of bit lines can be sensed using different respective sense blocks. This allows the processing load which is associated with the sense circuits to be divided up and handled by a respective processor in each sense block. For example, a sense circuit controller 560 in SB1 can communicate with the set of sense circuits and latches. The sense circuit controller 560 may include a pre-charge circuit 561 which provides a voltage to each sense circuit for setting a pre-charge voltage. In one possible approach, the voltage is provided to each sense circuit independently, e.g., via the data bus and a local bus. In another possible approach, a common voltage is provided to each sense circuit concurrently. The sense circuit controller 560 may also include a pre-charge circuit 561, a memory 562 and a processor 563. The memory 562 may store code which is executable by the processor to perform the functions described herein. These functions can include reading the latches 550b, 551b, 552b, 553b which are associated with the sense circuits 550a, 551a, 552a, 553a, setting bit values in the latches and providing voltages for setting pre-charge levels in sense nodes of the sense circuits 550a, 551a, 552a, 553a. Further example details of the sense circuit controller 560 and the sense circuits 550a, 551a, 552a, 553a are provided below.

In some embodiments, a memory cell may include a flag register that includes a set of latches storing flag bits. In some embodiments, a quantity of flag registers may correspond to a quantity of data states. In some embodiments, one or more flag registers may be used to control a type of verification technique used when verifying memory cells. In some embodiments, a flag bit's output may modify associated logic of the device, e.g., address decoding circuitry, such that a specified block of cells is selected. A bulk operation (e.g., an erase operation, etc.) may be carried out using the flags set in the flag register, or a combination of the flag register with the address register, as in implied addressing, or alternatively by straight addressing with the address register alone.

Figure 6A:
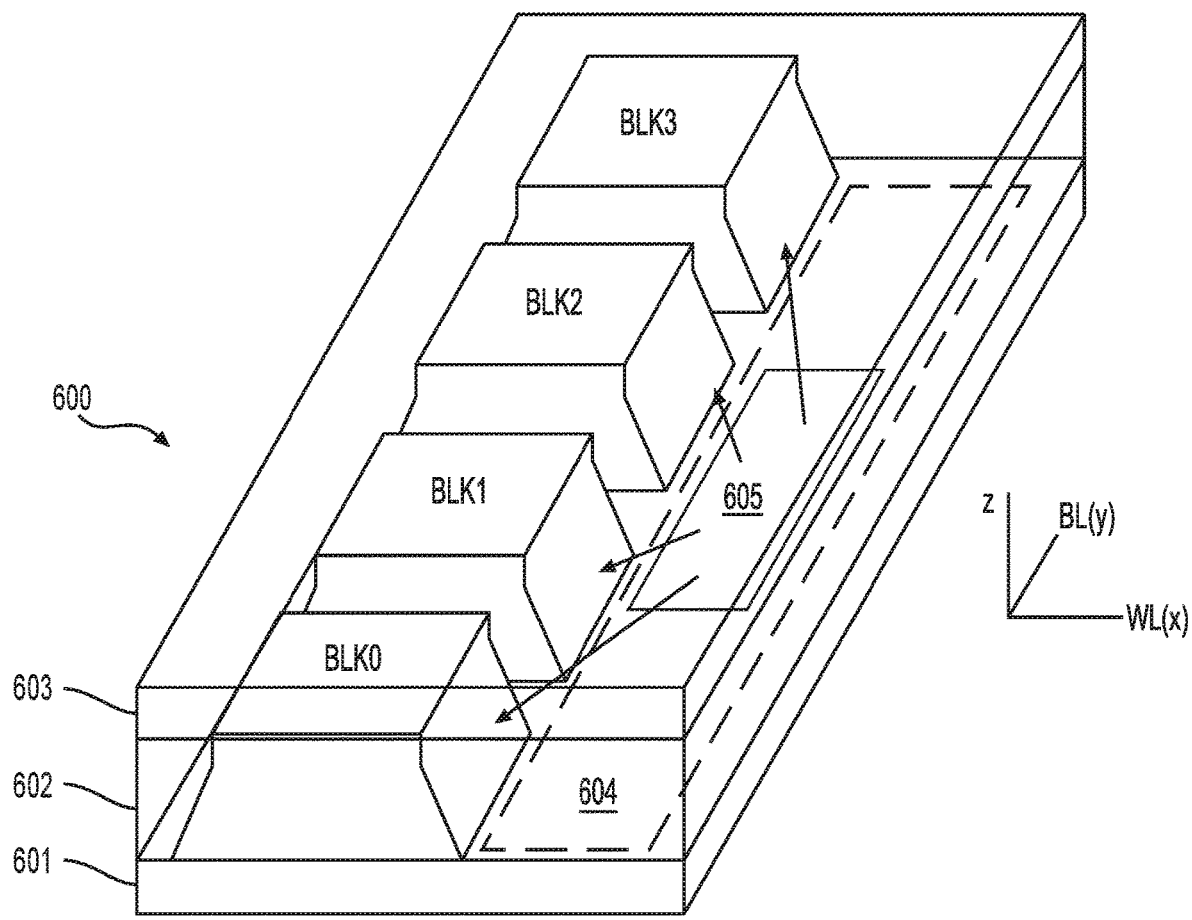
FIG. 6A is a perspective view of a set of blocks in an example three-dimensional configuration of the memory array of FIG. 1.

FIG. 6A is a perspective view of a set of blocks 600 in an example three-dimensional configuration of the memory array 126 of FIG. 1. On the substrate are example blocks BLK0, BLK1, BLK2, BLK3 of memory cells (storage elements) and a peripheral area 604 with circuitry for use by the blocks BLK0, BLK1, BLK2, BLK3. For example, the circuitry can include voltage drivers 605 which can be connected to control gate layers of the blocks BLK0, BLK1, BLK2, BLK3. In one approach, control gate layers at a common height in the blocks BLK0, BLK1, BLK2, BLK3 are commonly driven. The substrate 601 can also carry circuitry under the blocks BLK0, BLK1, BLK2, BLK3, along with one or more lower metal layers which are patterned in conductive paths to carry signals of the circuitry. The blocks BLK0, BLK1, BLK2, BLK3 are formed in an intermediate region 602 of the memory device. In an upper region 603 of the memory device, one or more upper metal layers are patterned in conductive paths to carry signals of the circuitry. Each block BLK0, BLK1, BLK2, BLK3 comprises a stacked area of memory cells, where alternating levels of the stack represent word lines. In one possible approach, each block BLK0, BLK1, BLK2, BLK3 has opposing tiered sides from which vertical contacts extend upward to an upper metal layer to form connections to conductive paths. While four blocks BLK0, BLK1, BLK2, BLK3 are illustrated as an example, two or more blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 6B:
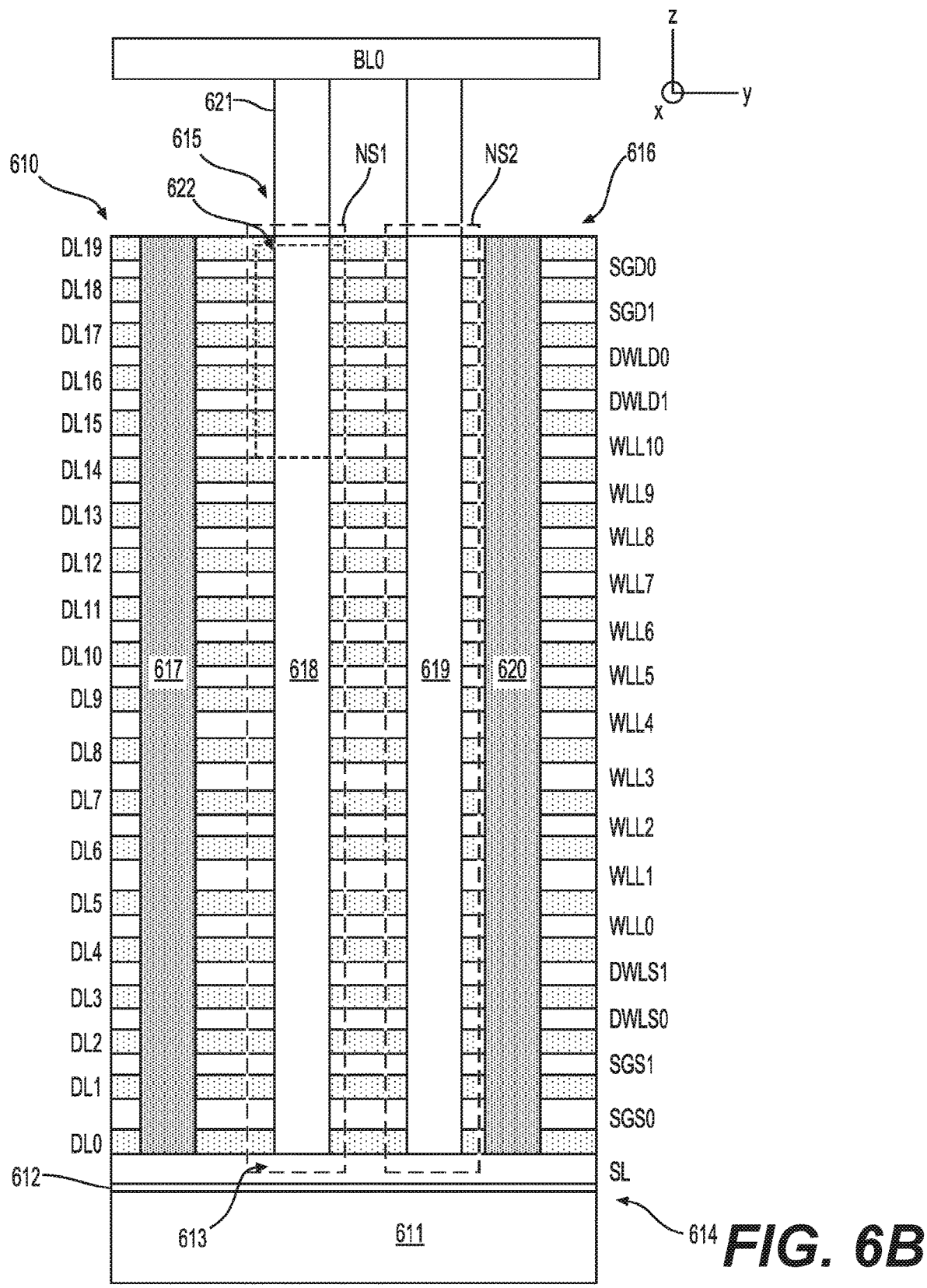
FIG. 6B depicts an example cross-sectional view of a portion of one of the blocks of FIG. 6A.

FIG. 6B illustrates an example cross-sectional view of a portion of one of the blocks BLK0, BLK1, BLK2, BLK3 of FIG. 6A. The block comprises a stack 610 of alternating conductive and dielectric layers. In this example, the conductive layers comprise two SGD layers, two SGS layers and four dummy word line layers DWLD0, DWLD1, DWLS0 and DWLS1, in addition to data word line layers (word lines) WLL0-WLL10. The dielectric layers are labelled as DL0-DL19. Further, regions of the stack 610 which comprise NAND strings NS1 and NS2 are illustrated. Each NAND string encompasses a memory hole 618, 619 which is filled with materials which form memory cells adjacent to the word lines. A region 622 of the stack 610 is shown in greater detail in FIG. 6D and is discussed in further detail below.

The 610 stack includes a substrate 611, an insulating film 612 on the substrate 611, and a portion of a source line SL. NS1 has a source-end 613 at a bottom 614 of the stack and a drain-end 615 at a top 616 of the stack 610. Contact line connectors (e.g., slits, such as metal-filled slits) 617, 620 may be provided periodically across the stack 610 as interconnects which extend through the stack 610, such as to connect the source line to a particular contact line above the stack 610. The contact line connectors 617, 620 may be used during the formation of the word lines and subsequently filled with metal. A portion of a bit line BL0 is also illustrated. A conductive via 621 connects the drain-end 615 to BL0.

Figure 6C:
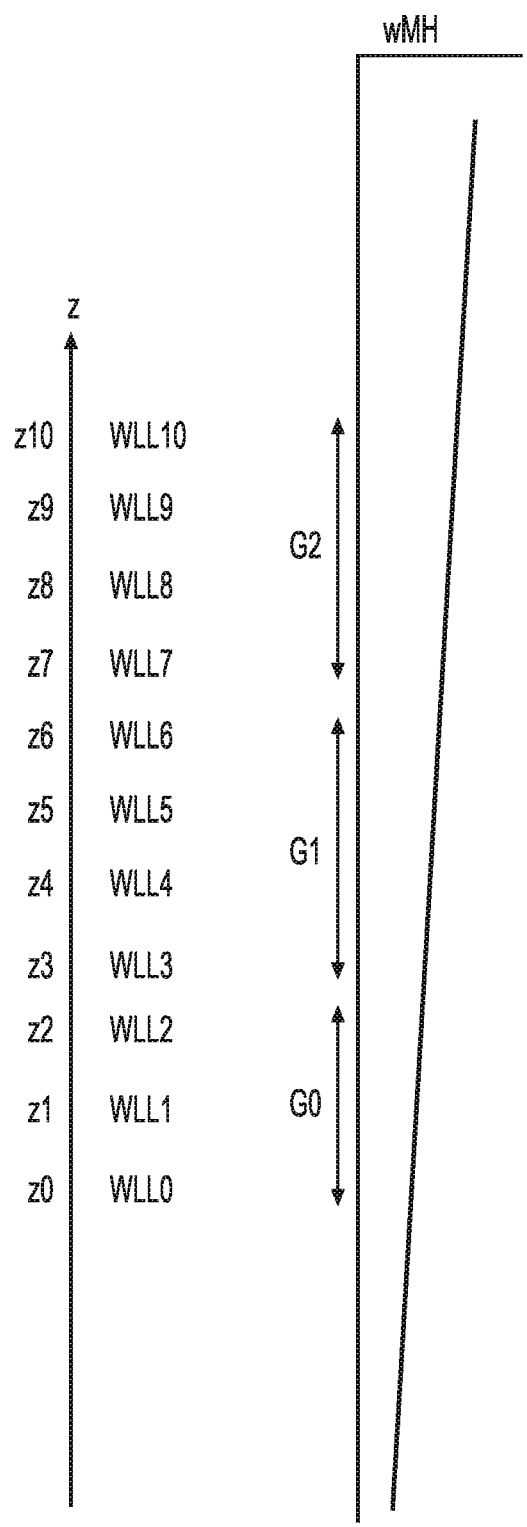
FIG. 6C depicts a plot of memory hole diameter in the stack of FIG. 6B.

FIG. 6C illustrates a plot of memory hole diameter in the stack of FIG. 6B. The vertical axis is aligned with the stack of FIG. 6B and illustrates a width (wMH), e.g., diameter, of the memory holes 618 and 619. The word line layers WLL0-WLL10 of FIG. 6A are repeated as an example and are at respective heights z0-z10 in the stack. In such a memory device, the memory holes which are etched through the stack have a very high aspect ratio. For example, a depth-to-diameter ratio of about 25-30 is common. The memory holes may have a circular cross-section. Due to the etching process, the memory hole width can vary along the length of the hole. Typically, the diameter becomes progressively smaller from the top to the bottom of the memory hole. That is, the memory holes are tapered, narrowing at the bottom of the stack. In some cases, a slight narrowing occurs at the top of the hole near the select gate so that the diameter becomes slightly wider before becoming progressively smaller from the top to the bottom of the memory hole.

Due to the non-uniformity in the width of the memory hole, the programming speed, including the program slope and erase speed of the memory cells can vary based on their position along the memory hole, e.g., based on their height in the stack. With a smaller diameter memory hole, the electric field across the tunnel oxide is relatively stronger, so that the programming and erase speed is relatively higher. One approach is to define groups of adjacent word lines for which the memory hole diameter is similar, e.g., within a defined range of diameter, and to apply an optimized verify scheme for each word line in a group. Different groups can have different optimized verify schemes.

Figure 6D:
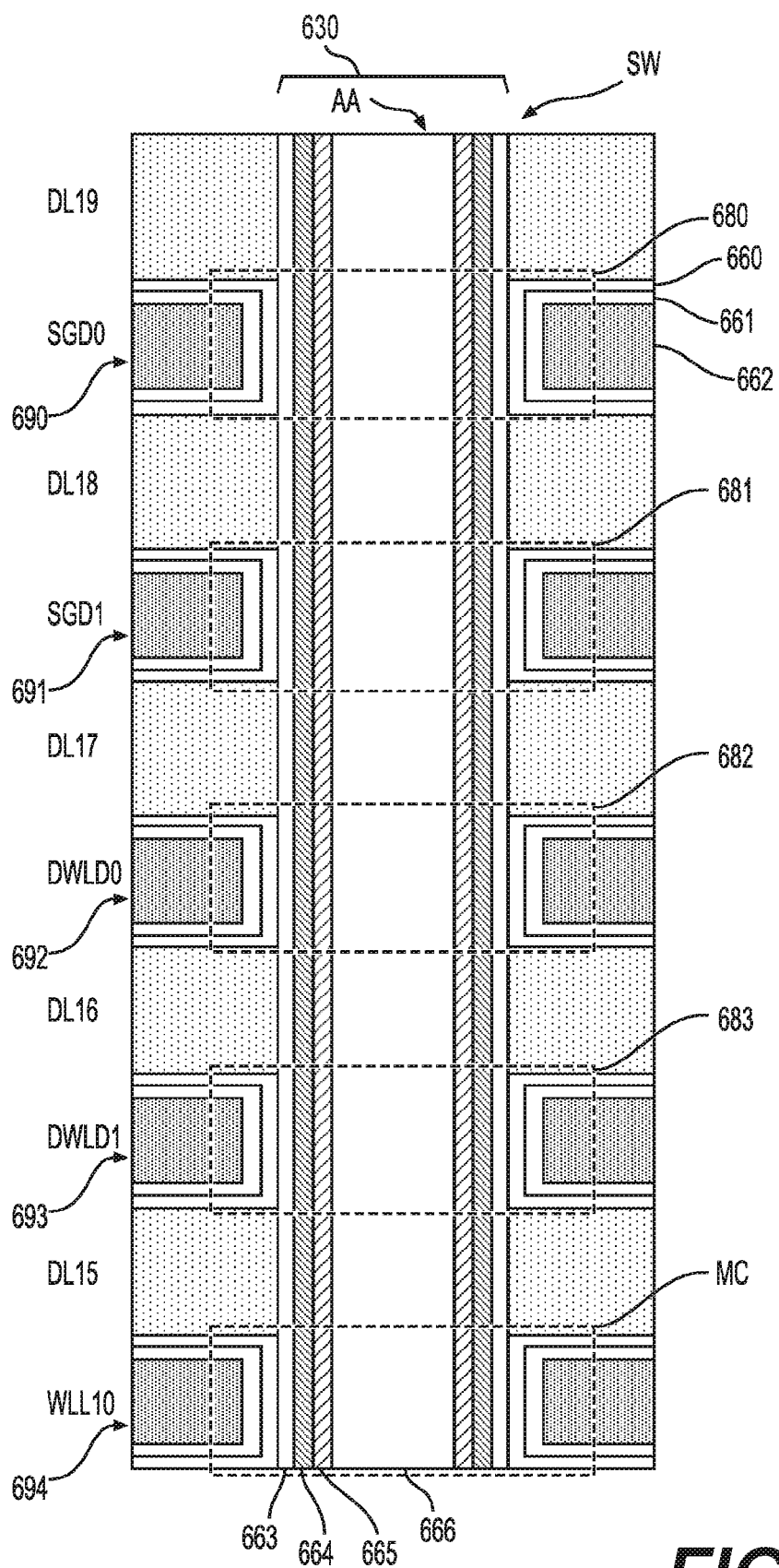
FIG. 6D depicts a close-up view of region 722 of the stack of FIG. 6B.

FIG. 6D illustrates a close-up view of the region 622 of the stack 610 of FIG. 6B. Memory cells are formed at the different levels of the stack at the intersection of a word line layer and a memory hole. In this example, SGD transistors 680, 681 are provided above dummy memory cells 682, 683 and a data memory cell MC. A number of layers can be deposited along the sidewall (SW) of the memory hole 630 and/or within each word line layer, e.g., using atomic layer deposition. For example, each column (e.g., the pillar which is formed by the materials within a memory hole 630) can include a charge-trapping layer or film 663 such as SiN or other nitride, a tunneling layer 664, a polysilicon body or channel 665, and a dielectric core 666. A word line layer can include a blocking oxide/block high-k material 660, a metal barrier 661, and a conductive metal 662 such as Tungsten as a control gate. For example, control gates 690, 691, 692, 693, and 694 are provided. In this example, all of the layers except the metal are provided in the memory hole 630. In other approaches, some of the layers can be in the control gate layer. Additional pillars are similarly formed in the different memory holes. A pillar can form a columnar active area (AA) of a NAND string.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes 630 can be filled with a plurality of annular layers comprising a blocking oxide layer, a charge trapping layer 663, a tunneling layer 664 and a channel layer. A core region of each of the memory holes 630 is filled with a body material, and the plurality of annular layers are between the core region and the word line in each of the memory holes 630.

The NAND string can be considered to have a floating body channel because the length of the channel is not formed on a substrate. Further, the NAND string is provided by a plurality of word line layers above one another in a stack, and separated from one another by dielectric layers.

Figure 7A:
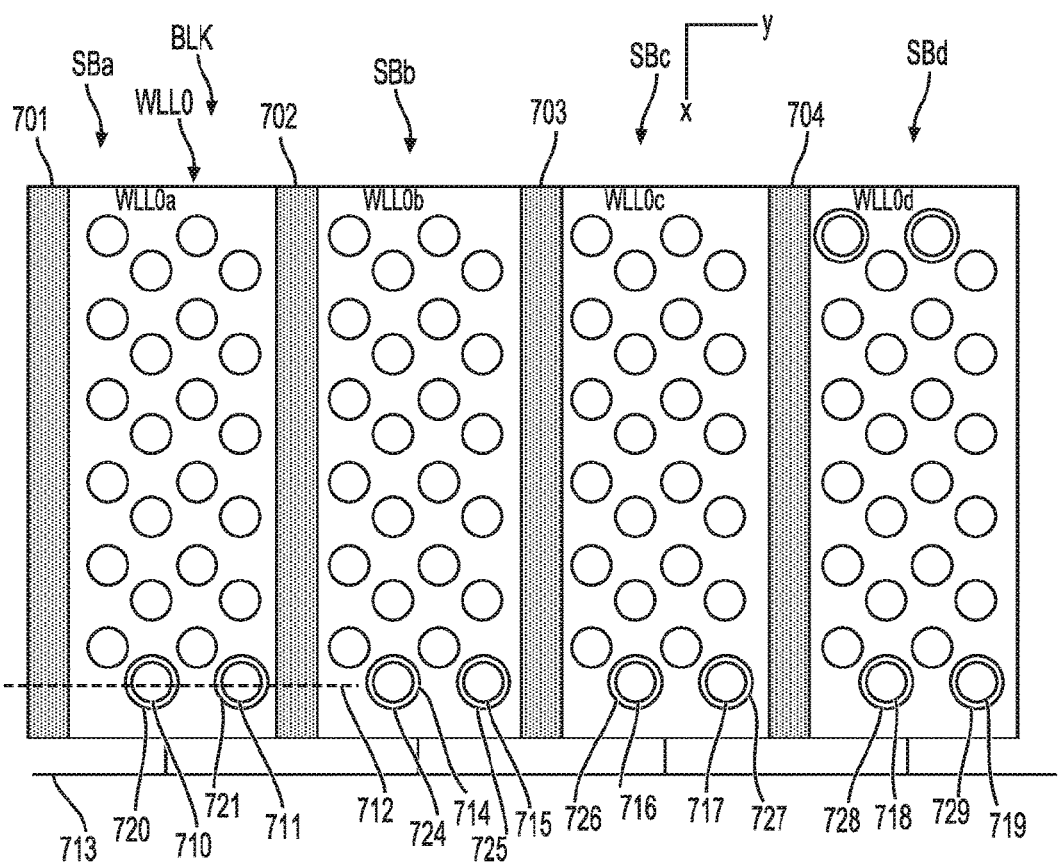
FIG. 7A depicts a top view of an example word line layer WLL0 of the stack of FIG. 6B.

FIG. 7A illustrates a top view of an example word line layer WLL0 of the stack 610 of FIG. 6B. As mentioned, a three-dimensional memory device can comprise a stack of alternating conductive and dielectric layers. The conductive layers provide the control gates of the SG transistors and memory cells. The layers used for the SG transistors are SG layers and the layers used for the memory cells are word line layers. Further, memory holes are formed in the stack and filled with a charge-trapping material and a channel material. As a result, a vertical NAND string is formed. Source lines are connected to the NAND strings below the stack and bit lines are connected to the NAND strings above the stack.

A block BLK in a three-dimensional memory device can be divided into sub-blocks, where each sub-block comprises a NAND string group which has a common SGD control line. For example, see the SGD lines/control gates SGD0, SGD1, SGD2 and SGD3 in the sub-blocks SBa, SBb, SBc and SBd, respectively. Further, a word line layer in a block can be divided into regions. Each region is in a respective sub-block and can extend between contact line connectors (e.g., slits) which are formed periodically in the stack to process the word line layers during the fabrication process of the memory device. This processing can include replacing a sacrificial material of the word line layers with metal. Generally, the distance between contact line connectors should be relatively small to account for a limit in the distance that an etchant can travel laterally to remove the sacrificial material, and that the metal can travel to fill a void which is created by the removal of the sacrificial material. For example, the distance between contact line connectors may allow for a few rows of memory holes between adjacent contact line connectors. The layout of the memory holes and contact line connectors should also account for a limit in the number of bit lines which can extend across the region while each bit line is connected to a different memory cell. After processing the word line layers, the contact line connectors can optionally be filed with metal to provide an interconnect through the stack.

Figure 7B:
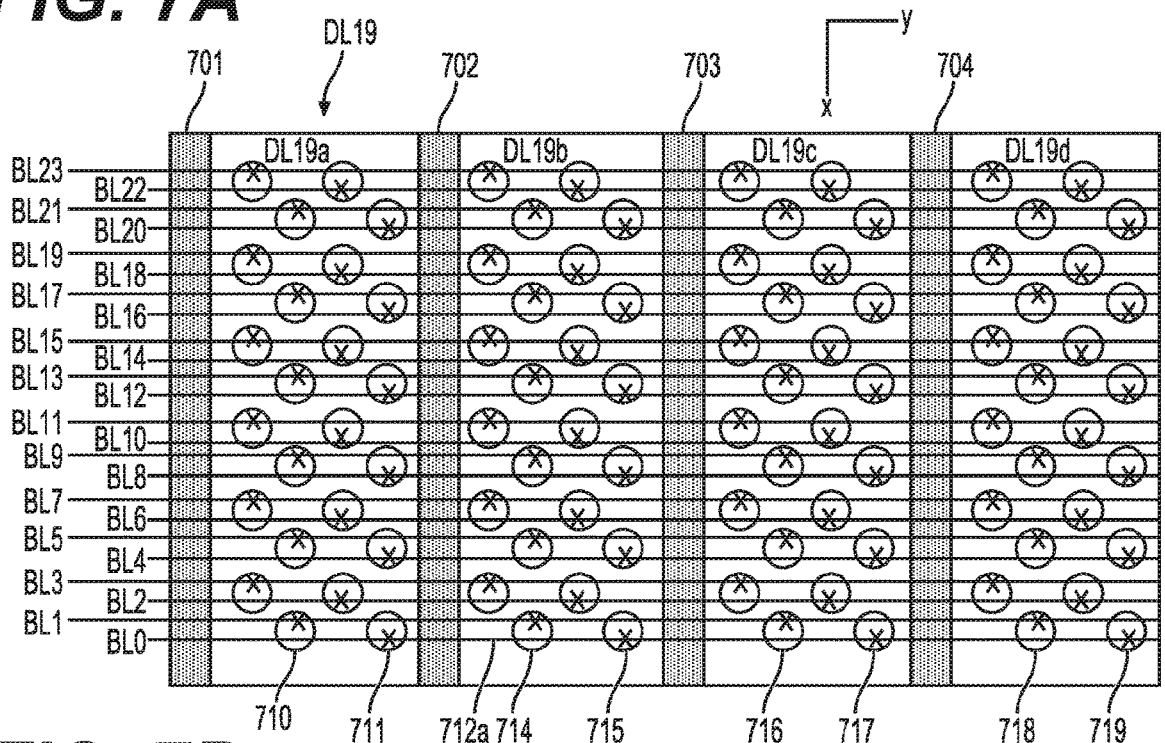
FIG. 7B depicts a top view of an example top dielectric layer DL19 of the stack of FIG. 6B.

In this example, there are four rows of memory holes between adjacent contact line connectors. A row here is a group of memory holes which are aligned in the x-direction. Moreover, the rows of memory holes are in a staggered pattern to increase the density of the memory holes. The word line layer or word line is divided into regions WLL0 a, WLL0 b, WLL0 c and WLL0 d which are each connected by a contact line 713. The last region of a word line layer in a block can be connected to a first region of a word line layer in a next block, in one approach. The contact line 713, in turn, is connected to a voltage driver for the word line layer. The region WLL0a has example memory holes 710, 711 along a contact line 712. The region WLL0b has example memory holes 714, 715. The region WLL0c has example memory holes 716, 717. The region WLL0d has example memory holes 718, 719. The memory holes are also shown in FIG. 7B. Each memory hole can be part of a respective NAND string. For example, the memory holes 710, 714, 716 and 718 can be part of NAND strings NS0_SBa, NS1_SBb, NS2_SBc, NS3_SBd, and NS4_SBe, respectively.

Each circle represents the cross-section of a memory hole at a word line layer or SG layer. Example circles shown with dashed lines represent memory cells which are provided by the materials in the memory hole and by the adjacent word line layer. For example, memory cells 820, 821 are in WLL0a, memory cells 824, 825 are in WLL0b, memory cells 826, 827 are in WLL0c, and memory cells 828, 829 are in WLL0d. These memory cells are at a common height in the stack.

Figure 8A:
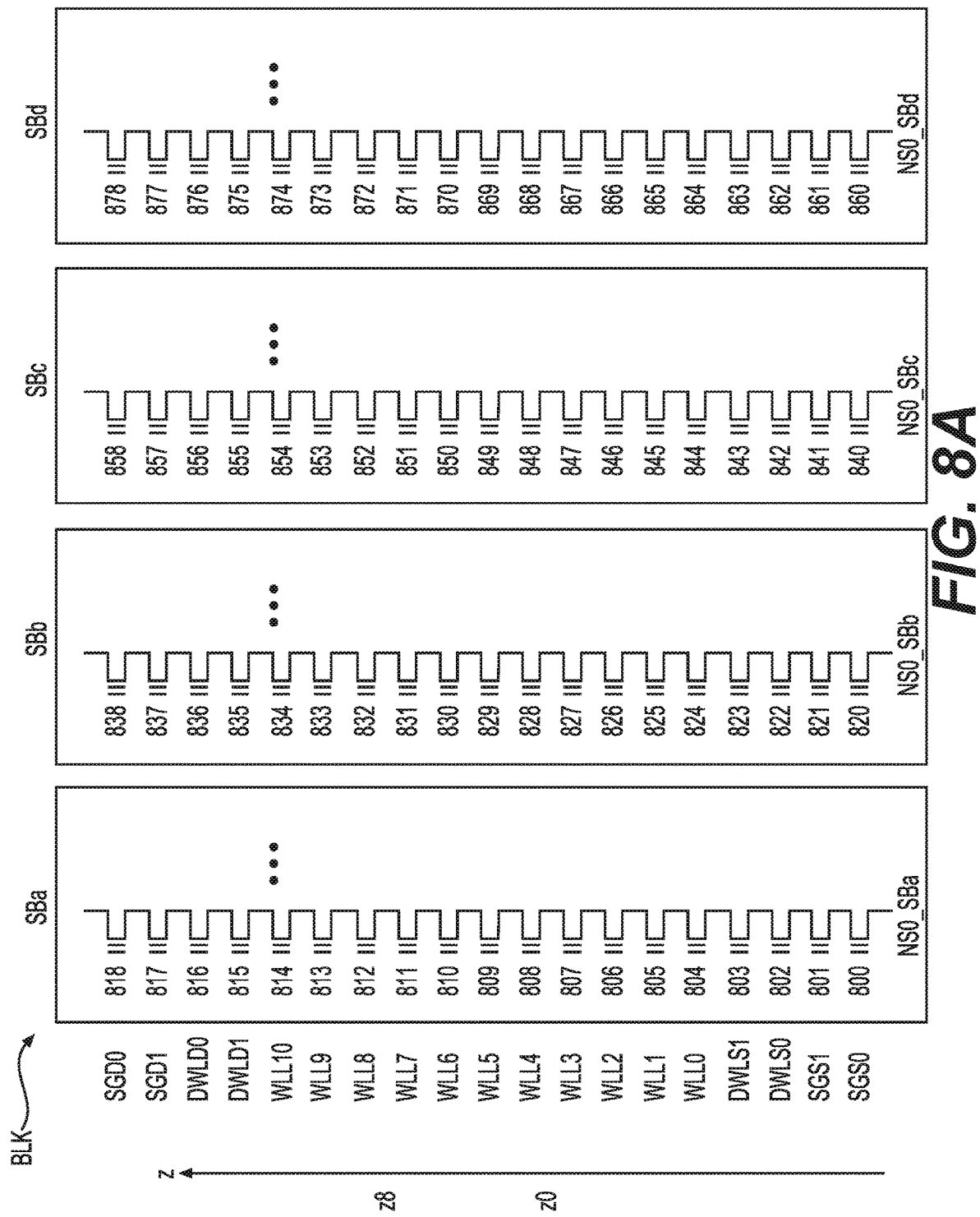
FIG. 8A depicts example NAND strings in the sub-blocks SBa-SBd of FIG. 7A.

Contact line connectors (e.g., slits, such as metal-filled slits) 801, 802, 803, 804 may be located between and adjacent to the edges of the regions WLL0a-WLL0d. The contact line connectors 801, 802, 803, 804 provide a conductive path from the bottom of the stack to the top of the stack. For example, a source line at the bottom of the stack may be connected to a conductive line above the stack, where the conductive line is connected to a voltage driver in a peripheral region of the memory device. See also FIG. 9A for further details of the sub-blocks SBa-SBd of FIG. 8A.

Figure 8B:
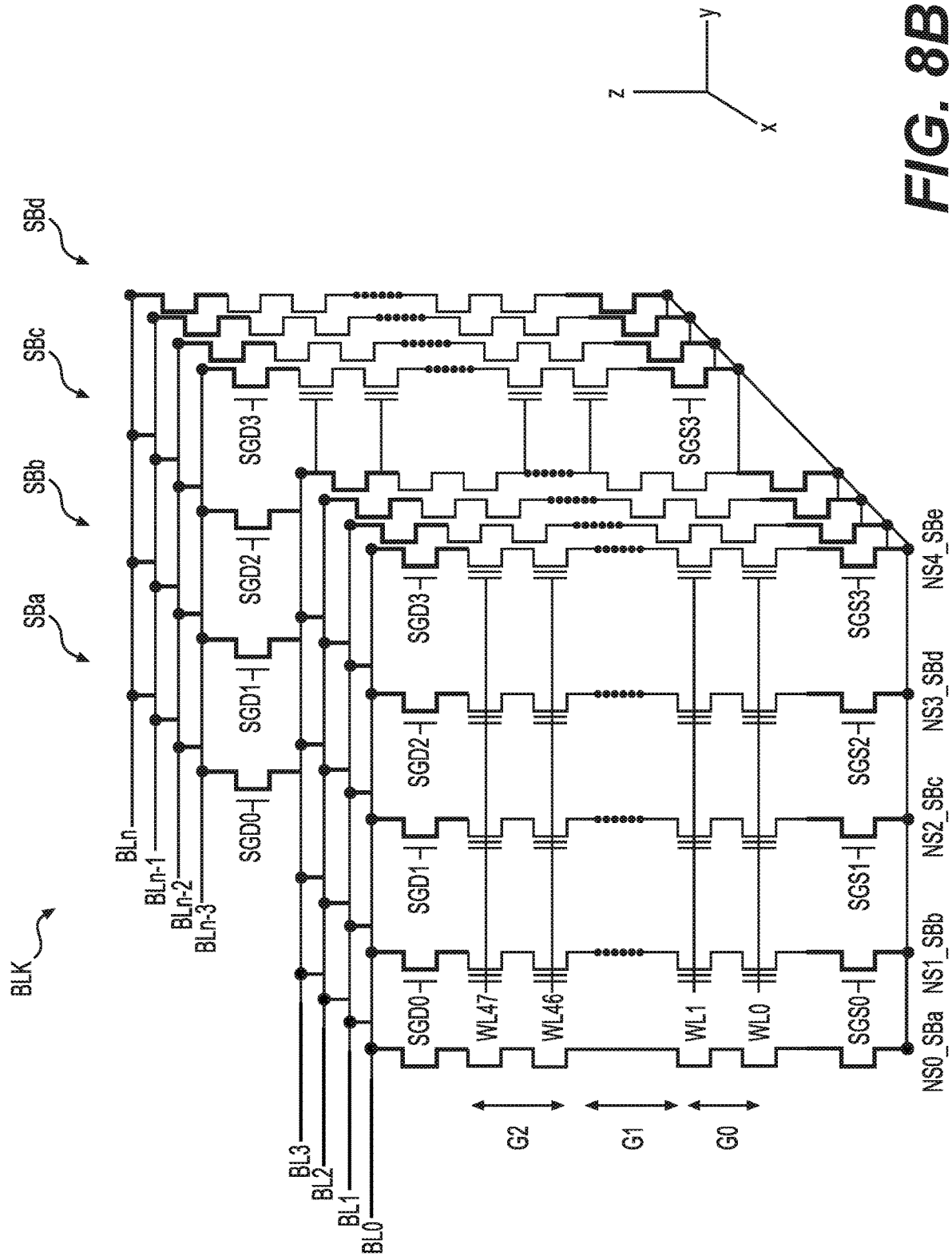
FIG. 8B depicts another example view of NAND strings in sub-blocks.

FIG. 8B illustrates a top view of an example top dielectric layer DL19 of the stack of FIG. 7B. The dielectric layer is divided into regions DL19a, DL19b, DL19c and DL19d. Each region can be connected to a respective voltage driver. This allows a set of memory cells in one region of a word line layer being programmed concurrently, with each memory cell being in a respective NAND string which is connected to a respective bit line. A voltage can be set on each bit line to allow or inhibit programming during each program voltage.

The region DL19a has the example memory holes 710, 711 along a contact line 712, which is coincident with a bit line BL0. A number of bit lines extend above the memory holes and are connected to the memory holes as indicated by the "X" symbols. BL0 is connected to a set of memory holes which includes the memory holes 711, 715, 717, 719. Another example bit line BL1 is connected to a set of memory holes which includes the memory holes 710, 714, 716, 718. The contact line connectors (e.g., slits, such as metal-filled slits) 701, 702, 703, 704 from FIG. 7A are also illustrated, as they extend vertically through the stack. The bit lines can be numbered in a sequence BL0-BL23 across the DL19 layer in the x-direction.

Different subsets of bit lines are connected to memory cells in different rows. For example, BL0, BL4, BL8, BL12, BL16, BL20 are connected to memory cells in a first row of cells at the right-hand edge of each region. BL2, BL6, BL10, BL14, BL18, BL22 are connected to memory cells in an adjacent row of cells, adjacent to the first row at the right-hand edge. BL3, BL7, BL11, BL15, BL19, BL23 are connected to memory cells in a first row of cells at the left-hand edge of each region. BL1, BL5, BL9, BL13, BL17, BL21 are connected to memory cells in an adjacent row of memory cells, adjacent to the first row at the left-hand edge.

The program-verify operation may be a full sequence programming operation or a multi-pass operation. In a full sequence operation, the cells of the selected word line are directly programmed to their intended data states using progressively increasing programming pulses until programming is completed. In a multi-pass programming operation, the cells are programmed in two or more programming passes.

One type of multi-pass programming operation is depicted in FIGS. 12A and 12B. FIG. 12A illustrates a first pass in which the memory cells are programmed from the erase state Er to the S1, S2, and S3 data states represented by distributions 1212, 1214, 1216 using lower verify levels Vv1L, Vv2L, Vv3L respectively. During the first pass, a relatively large programming voltage step size may be used to quickly program the memory cells to the respective lower verify levels. The second pass is depicted in FIG. 12B, and the S1, S2, and S3 data states are programmed from the respective lower distributions 1212, 1214, 1216 to respective final distributions 1202, 1204, 1206 using the nominal higher verify levels Vv1, Vv2, and Vv3, respectively. A relatively small programming voltage step size may be used in the second pass to slowly program the memory cells to the respective final distributions while avoiding a large overshoot. Additional data states may (e.g., the S4-S15 data states of FIG. 11) be also be programmed using the multi-pass programming operation depicted in FIGS. 12A and 12B by following the same procedure.

Figure 13:
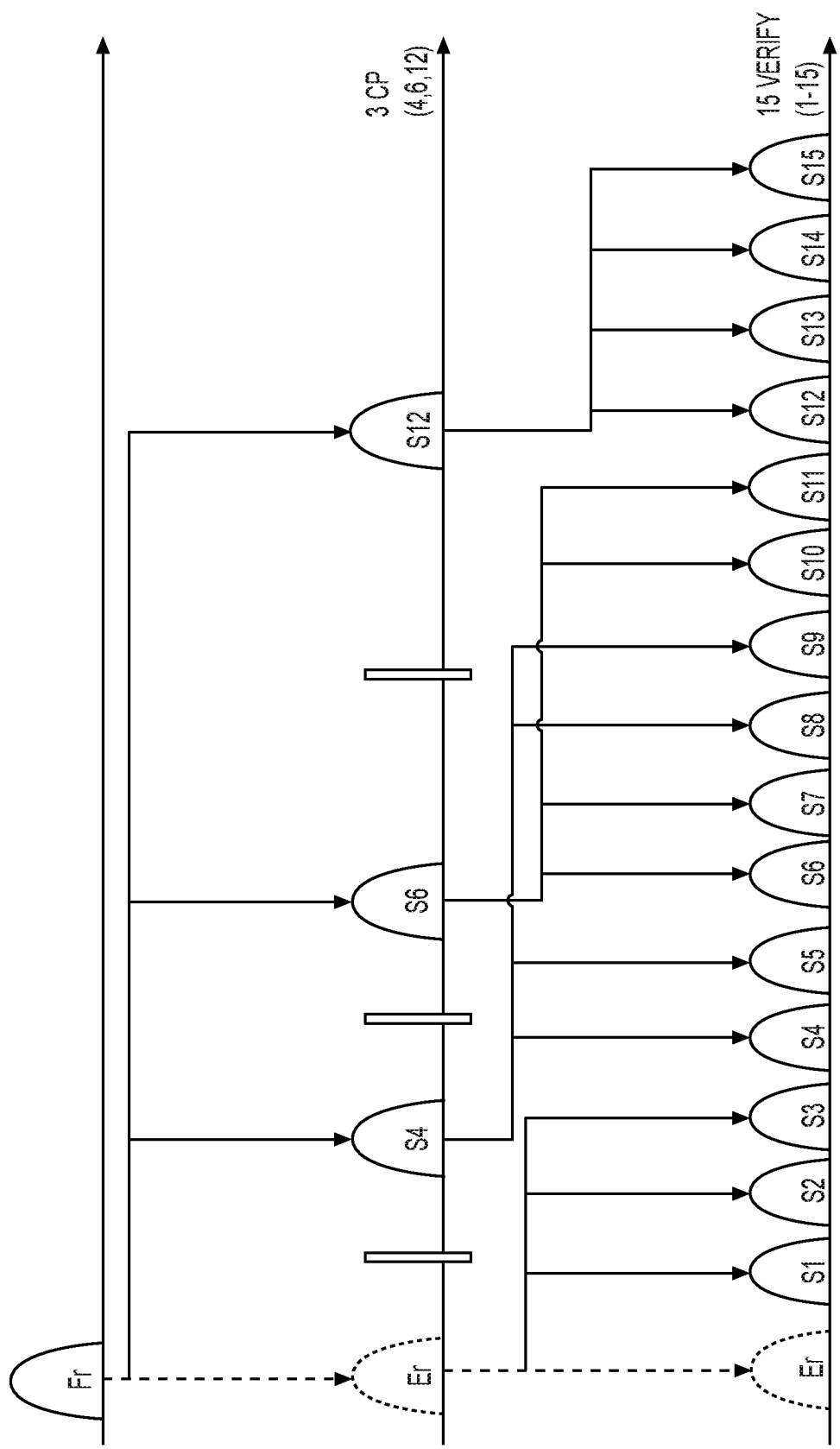
FIG. 13 depicts another embodiment of a two-pass programming technique.

Another type of multi-pass programming operation is depicted in FIG. 13. In a first pass, rather than programming the memory cells to all of the programmed data states S1-S15, the memory cells are programmed only to the S4, S6, and S12 data states. A relatively large voltage step size may be used in the first pass. In a second pass, the memory cells in the Er state are either left in the Er state or are programmed to the S1, S2, or S3 data states; the memory cells in the S4 data state are either left in the S4 data state or programmed to the S5, S10, or S11 data states; the memory cells in the S6 data state are either left in the S6 data state or programmed to the S7, S10, or S1l data states; and the memory cells of the S12 data state are either left in the S12 data state or are programmed to the S13, S14, or S15 data states. In some embodiments, the first and second passes may take different forms, e.g., the memory cells could be programmed to different data states in the first pass than the S4, S6, and S12 data states.

The following discussion is applicable to a full sequence programming operation or either or both passes of a multi-pass programming operation, such as either of the multi-pass programming operations discussed above and illustrated in FIGS. 12 and 13.

Figure 14:
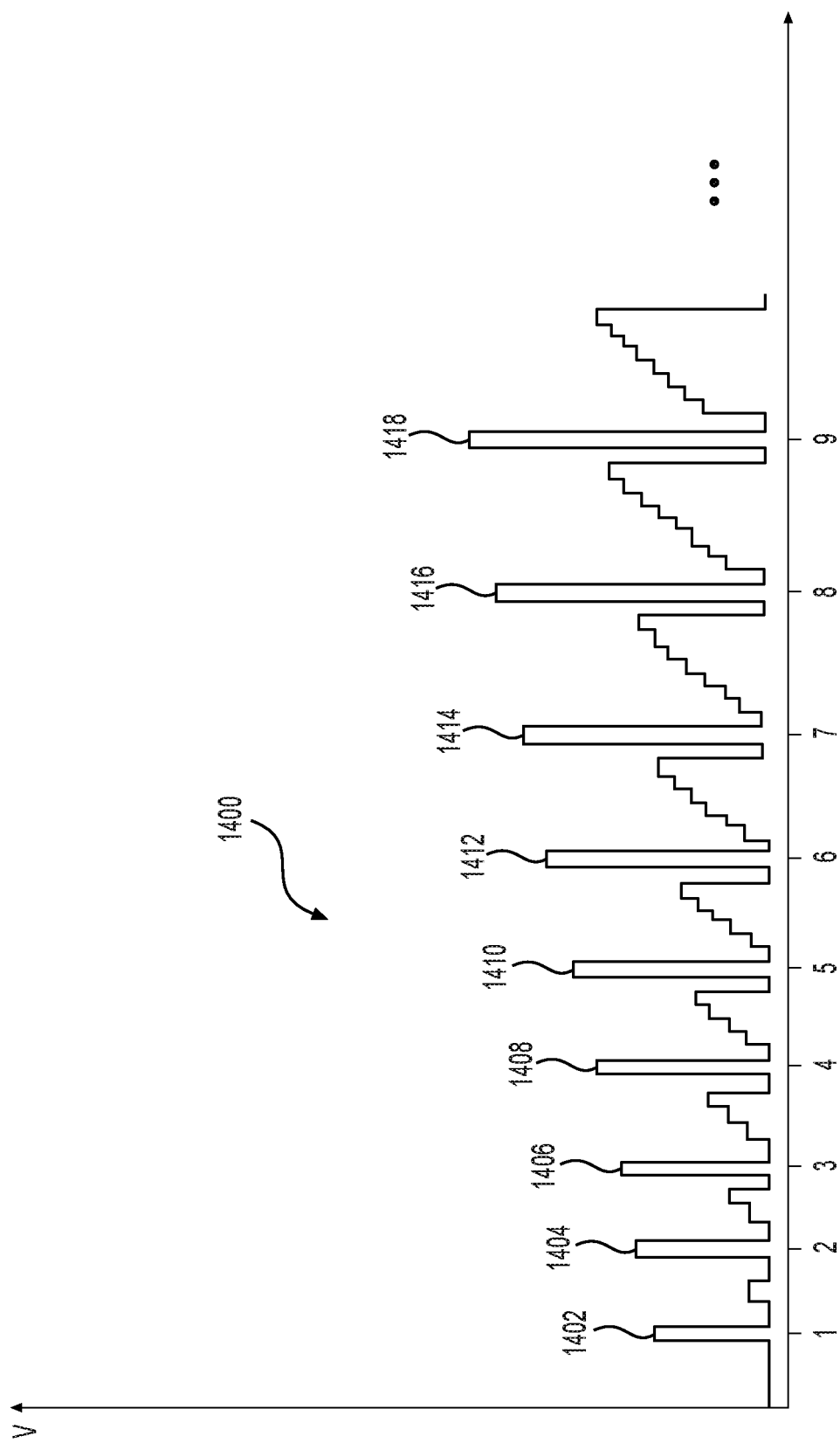
FIG. 14 depicts a waveform of an example memory cell programming operation.

FIG. 14 depicts a waveform 1400 of an example memory cell programming operation. The horizontal axis depicts time, and the vertical axis depicts control gate or word line voltage. Generally, a programming operation can involve applying a pulse train to a selected word line, where the pulse train includes multiple program loops or program-verify iterations. The program portion of the program-verify iteration includes a Vpgm pulse, and the verify portion of the program-verify iteration includes one or more verify pulses.

A square waveform is depicted for each pulse for simplicity; however, other shapes are possible, such as a multilevel shape or a ramped shape. Further, Incremental Step Pulse Programming (ISPP) is used in this example, in which the Vpgm pulse amplitude steps up in each successive program loop. This example uses ISPP in a single programming pass in which the programming is completed. ISPP can also be used in either or both programming passes of a multi-pass operation.

The pulse train includes Vpgm pulses that increase stepwise in amplitude with each program-verify iteration using a fixed step size (dVpgm). A new pulse train starts at an initial Vpgm pulse level and ends at a final Vpgm pulse level which does not exceed a maximum allowed level. The pulse train 1400 includes a series of Vpgm pulses 1402, 1404, 1406, 1408, 1410, 1412, 1414, 1416, 1418 . . . that are applied to a selected word line that includes a set of non-volatile memory cells. One, two, three, or more verify voltage pulses are provided after each Vpgm pulse as an example, based on the target memory states which are being verified. A voltage of 0 V may be applied to a selected word line between the Vpgm pulses and verify voltage pulses.

Figure 15:
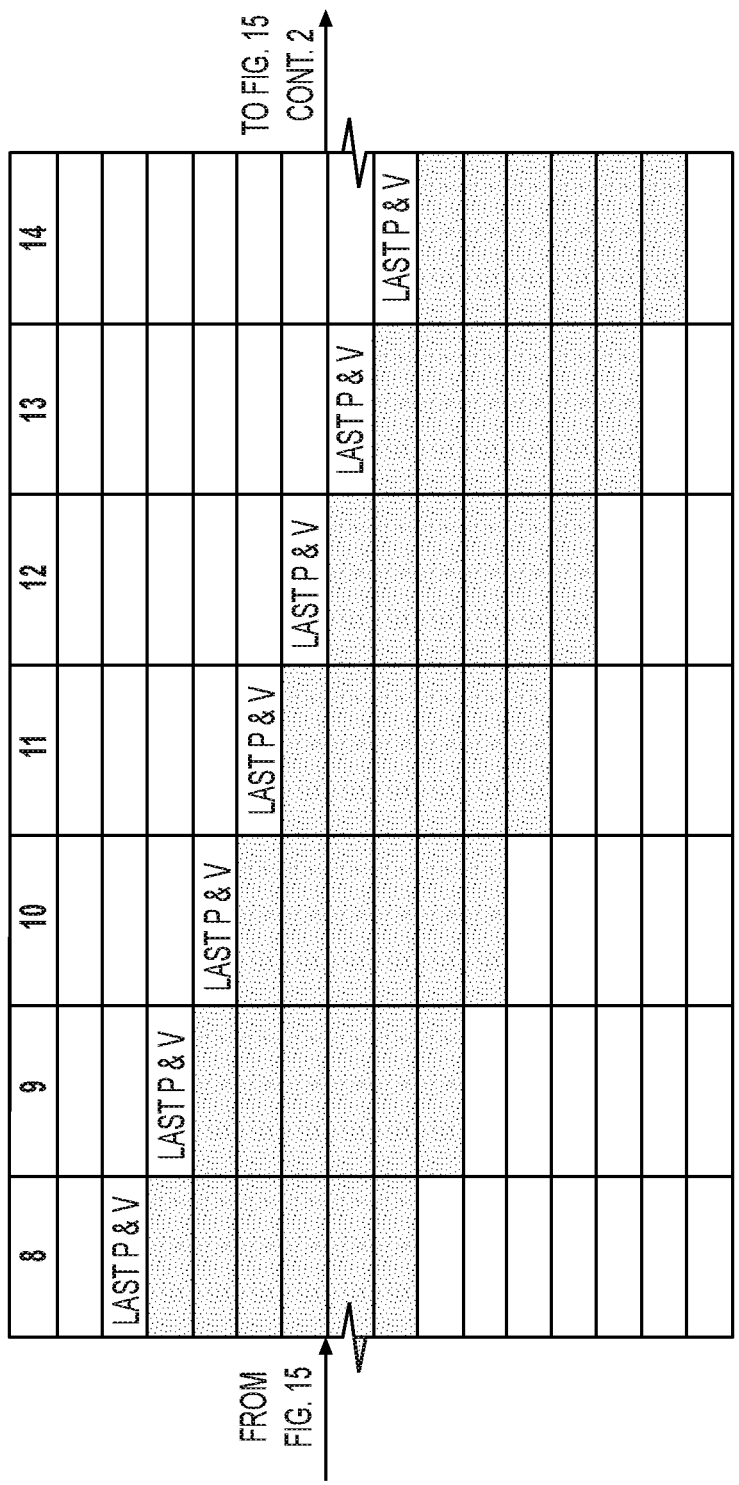
FIG. 15 depicts a chart of program verify iterations versus data state showing which verify tests are performed in which program verify iterations for a set of memory cells according to one programming technique.
Figure 15:
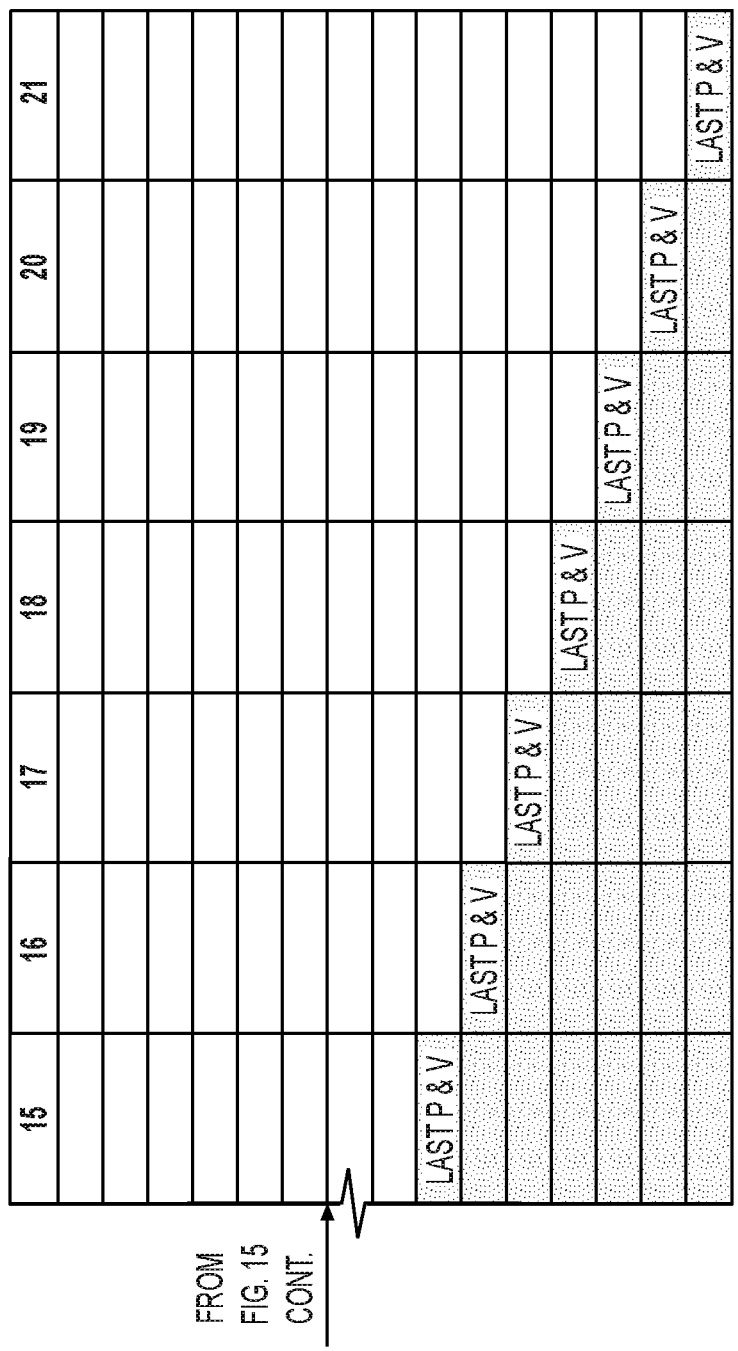

In FIG. 14, the verify voltage Vv1 is applied in after each of the first seven Vpgm pulses 1402, 1404, 1406, 1408, 1410, 1412, 1414. The verify voltage Vv2 is also applied after total of seven Vpgm pulses but starting with the second pulse 1404 and ending after pulse the eighth pulse 1416. Likewise, the verify voltage Vv3 is applied after a total of seven Vpgm pulses but starting with the third pulse 1406 and ending after the ninth pulse 1418. In this example, this pattern is continued until all fifteen verify pulses (Vv1-Vv15 in FIG. 10) have been applied. Thus, in this example, a total of one hundred and five verify pulses (seven for each of the fifteen data states) are applied during the program operation. This pattern is illustrated to completion in the table shown in FIG. 15. As mentioned before, for every data state, the bitscan operation could be entirely or mostly prior to the subsequent programing pulse. In that case, technically, one more programing pulse will be applied for that state after last program and verify pulses shown in FIG. 15. But, since this pulse is applied for the non-inhibited cells within the bit-ignore limit, and is not necessary for the actual program completion, it has not been included in FIG. 15.

Figure 16:
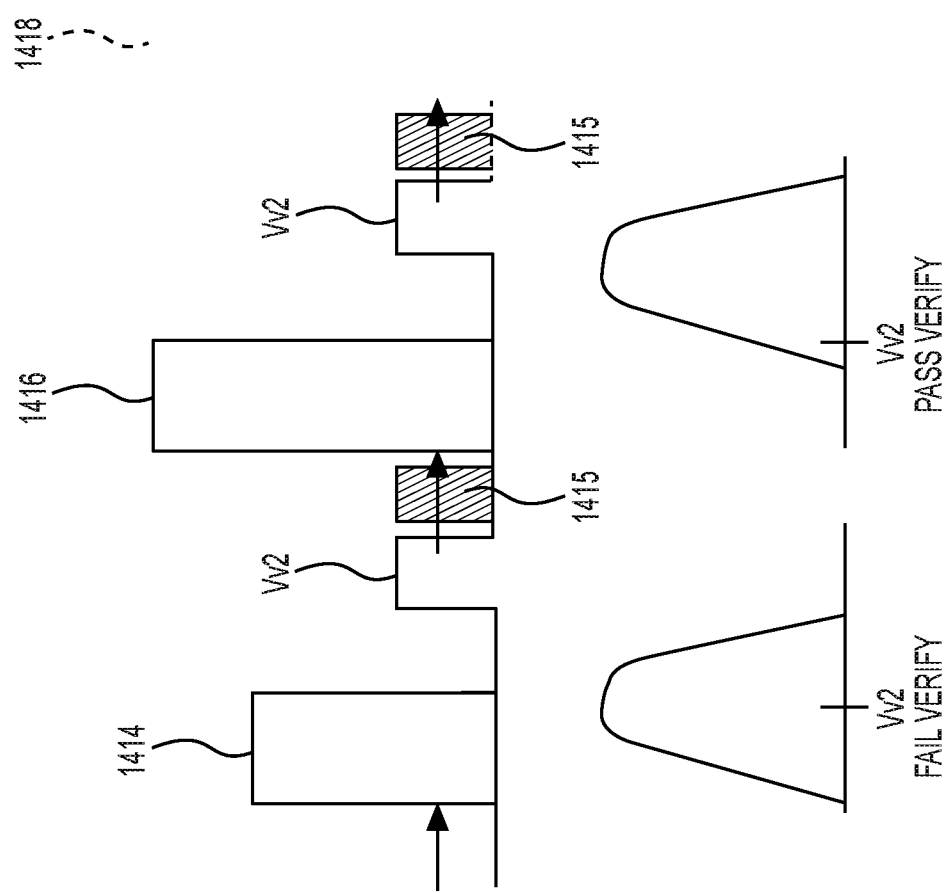
FIG. 16 depicts a waveform for the last two program loops during programming of a plurality of memory cells to a memory state using one programming operation and a voltage threshold distribution following each program loop.

FIG. 16 depicts a simplified waveform illustrating the last couple of program loops to program at least one memory cell to the data state S2 with the other verify pulses being hidden for illustrative purposes. As illustrated, verify pulses Vv2 for the S2 data state follow each of the 1414 and 1416 Vpgm pulses. The bitscan operation 1415 is conducted in between each of the verify pulses Vv2 and prior to the application of the subsequent programming pulse. In some embodiments, the subsequent programming pulse may begin prior to completion of the bitscan operation, i.e., the bitscan operation and the subsequent programming pulse may partially overlap in time. In this example, the verify operation fails after the 1414 Vpgm pulse but passes following the 1416 Vpgm pulse.

Figure 17:
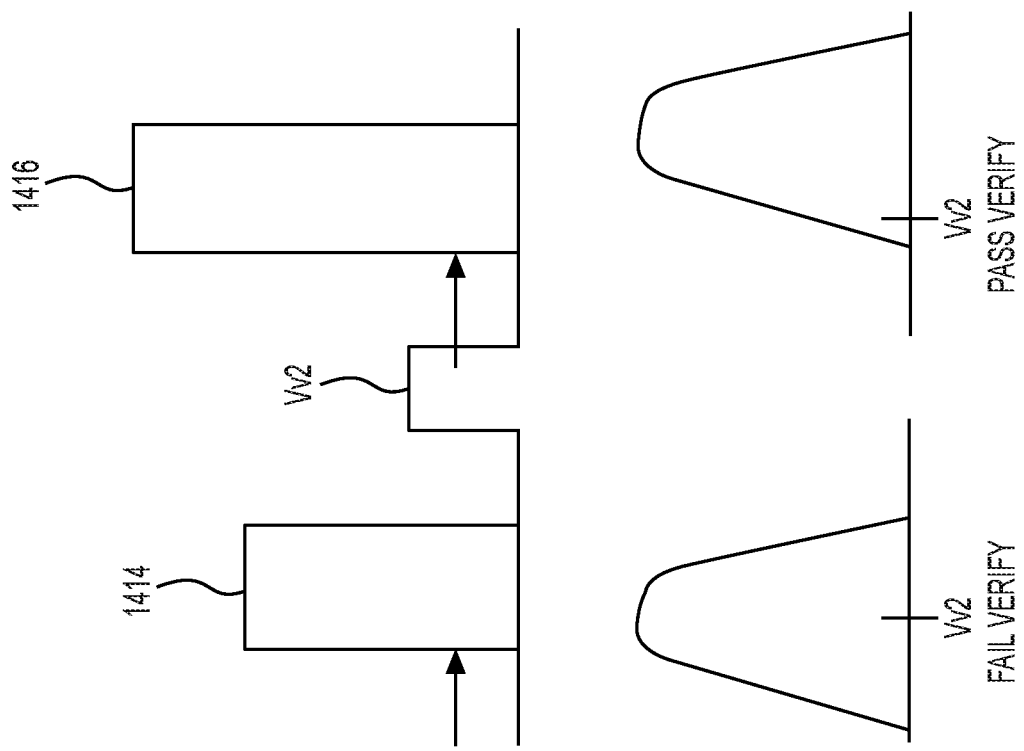
FIG. 17 depicts a waveform for the last two program loops during programming of a plurality of memory cells to a memory state using a programming technique according to an exemplary embodiment and a voltage threshold distribution following each program loop.

In an embodiment of the present disclosure, programming of the first data state S1 commences unchanged. However, with reference to FIG. 17, for the next programmed data state, for example, data state S2, the verify pulse and the bitscan operation following the 1416 Vpgm pulse are skipped in this embodiment, and this skipping of the last verify pulse and bitscan operation are repeated for all subsequent data states (the S3-15 data states) until programming of the selected word line is completed. Also, in case of FIG. 17, bitscan operations are skipped for all the programming pulses even before 1416 and this skipping is also repeated for all subsequent data states (the S3-15 data states) until programming of the selected word line is completed. In other words, the final verify pulse and all the bitscan operations are eliminated, or skipped, during each of the data states S2-S15, thereby reducing the programming time tprog. This is depicted in the table shown in FIG. 18, which illustrates that the final verify pulse is skipped for all of data states S2-S15. Skipping these verify pulses and bitscan operations reduces programming time tprog, as compared to the programming operation depicted in FIG. 15, by the amount of time it takes to perform one verify pulse times fourteen (one for each of data states S2-S15) and by an additional amount of time to perform bitscans (or bitscan overhead times, in case some of the bitscan times are hidden i.e., if bitscans are performed partially in parallel to other operations) for all the data states S2-S15.

In another embodiment where data state S2 is the first programmed data state, then the programming of data state S2 commences unchanged, and the final verify pulse and all the bitscan operations for each of data states S3-S15 may be eliminated. This pattern continues for any suitable first programmed data state. In other words, the number of programming pulses matches the number of verify pulses for the first programmed data state of the programming operation, and the number of verify pulses are each one less than the number of programming pulses for each subsequent data state (i.e., each data state programmed after the first programmed data state), while all the bitscan operations are skipped for all these subsequent data states.

Figure 18:
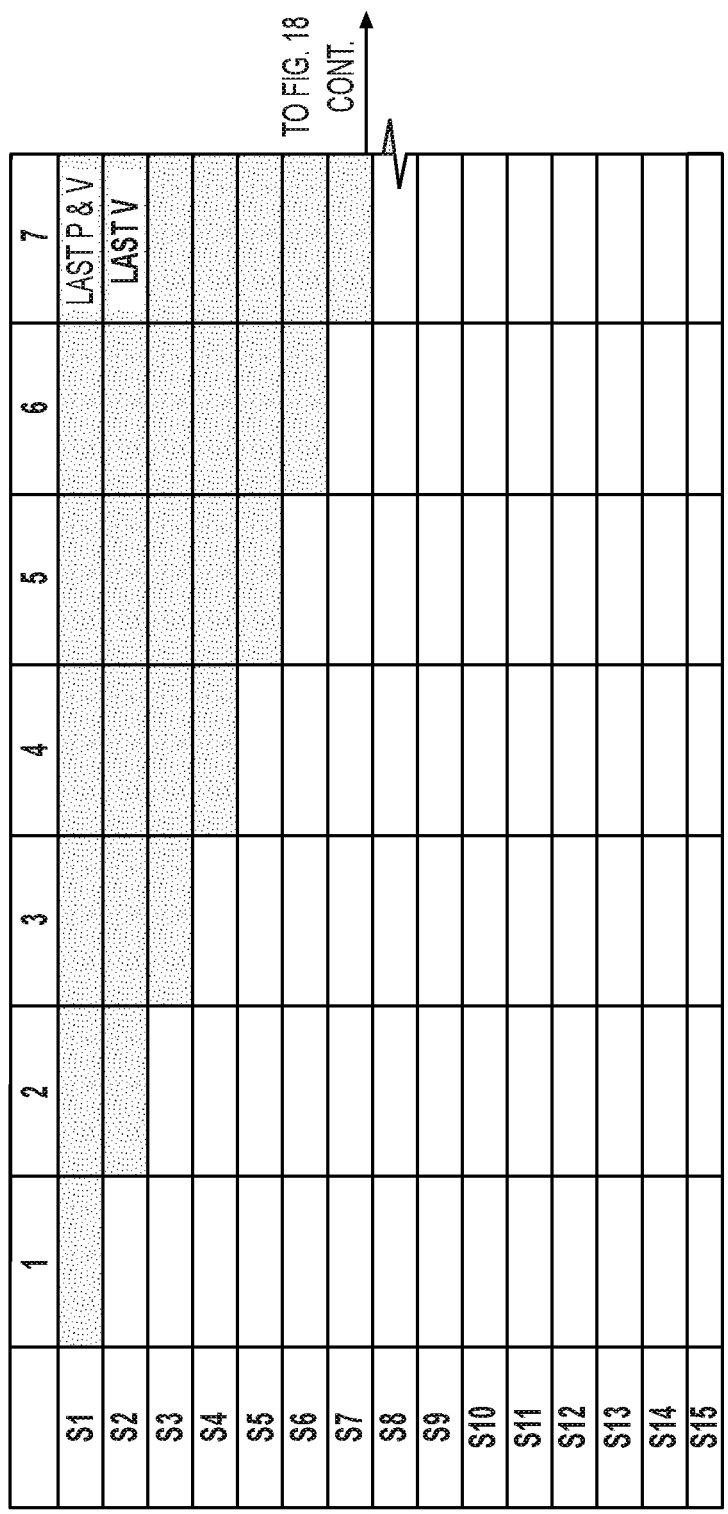
FIG. 18 depicts a chart of program verify iterations versus data state showing which verify tests are performed in which program verify iterations for a set of memory cells according to a different programming technique than FIG. 15.
Figure 18:
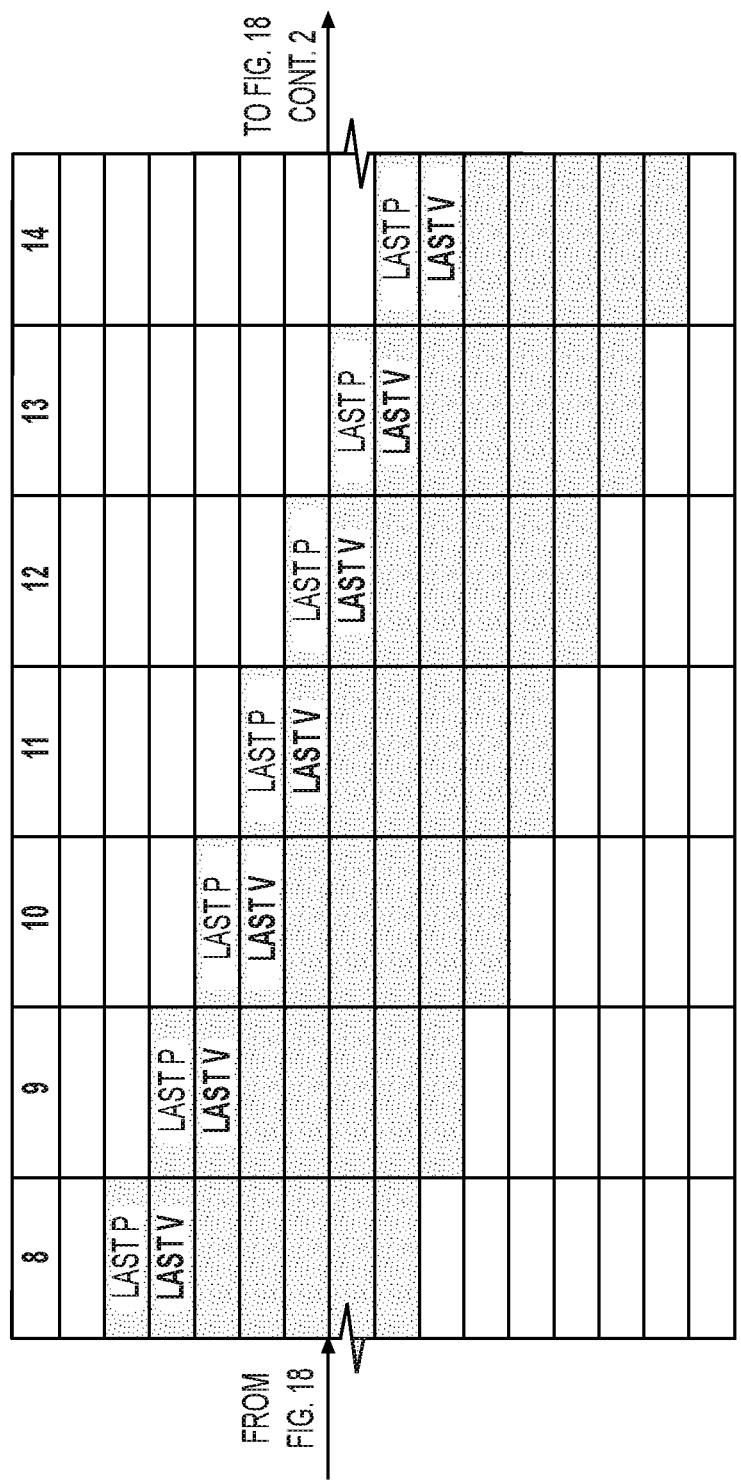
Figure 18:
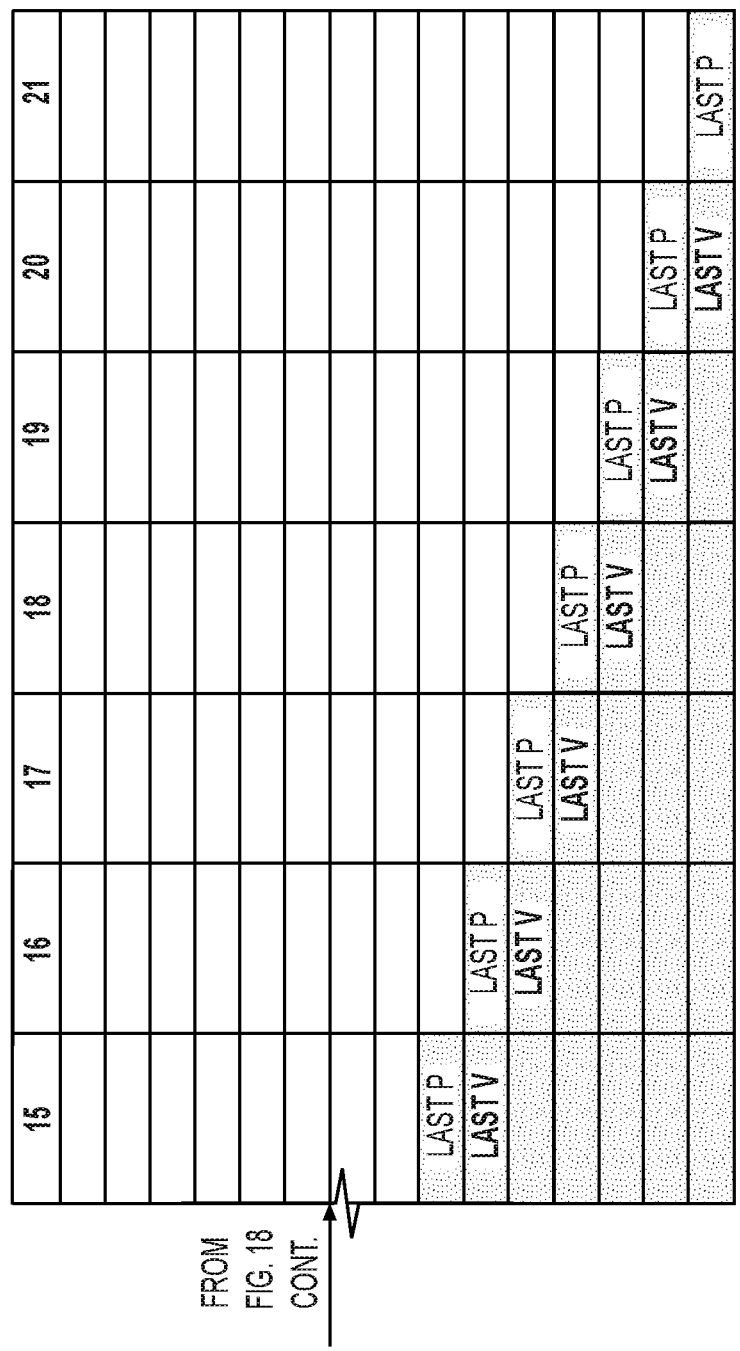

In the example shown in the table of FIG. 18, the same number of program loops are conducted for each of the programmed data states S1-S15 with the final verify pulse being skipped in the final program loop. In some cases, particularly for the data states at higher voltage thresholds, it may be desirable to perform one or more additional program loops to fully program the memory cells. The number of additional program loops (hereinafter referred to as "offset loops"), each including a Vpgm pulse and a verify pulse, for each of the data states may be based at least partially on an acceptable bit ignore criteria (sometimes referred to as BSPF) that is predetermined experimentally. Generally, more offset loops are required for higher data states than for lower data states, and more offset loops are required for lower bit ignore criteria than for higher bit ignore criteria.

The number of offset loops that are required for each data state can be determined experimentally by performing a conventional programming operation on a block one or more times with the Vpgm pulses increasing by a fixed step size Vpgm between program loops and counting and logging the number of program loops required to complete programming for each of the programmed data states S1-S15. This process can be repeated to determine an average number of program loops for each data state. For each data state S2-S15, the average number of program loops is compared to the average number of program loops required to complete programming for data state S1, and the number of offset loops is calculated to be the difference between the average or median number of program loops required to complete programming for the respective data state and the average or median number of program loops required to complete programming for data state S1. For example, the number of offset loops for data state S15 is set to the median number of program loops required to complete programming of data state S15 minus the median number of program loops required to complete programming of data state S1. The method to calculate offset loops is not limited to the above-explained method and several other methods could be employed to determine the offset loops.

Once the number of offset loops for each data state has been determined experimentally, they can be loaded into a database within the memory system that can be referenced by the programming circuit of the memory system during programming. FIGS. 19A, 19B, and 19C show three examples of the numbers of offset loops required at each of the programmed data states for memory systems having three different bit ignore criteria with FIG. 19A having the lowest bit ignore criteria, FIG. 19B having an intermediate bit ignore criteria, and FIG. 19C having the highest bit ignore criteria. As can be seen, in FIG. 19C, the fewest total offset loops are required to complete programming of all of the data states S1-S15 because the bit ignore criteria is the highest, indicating that the memory system is capable of accommodating less accurate programming. In contrast, in FIG. 19A, the most total offset loops are required, and three offset loops are included for data states S14 and S15.

Figure 20:
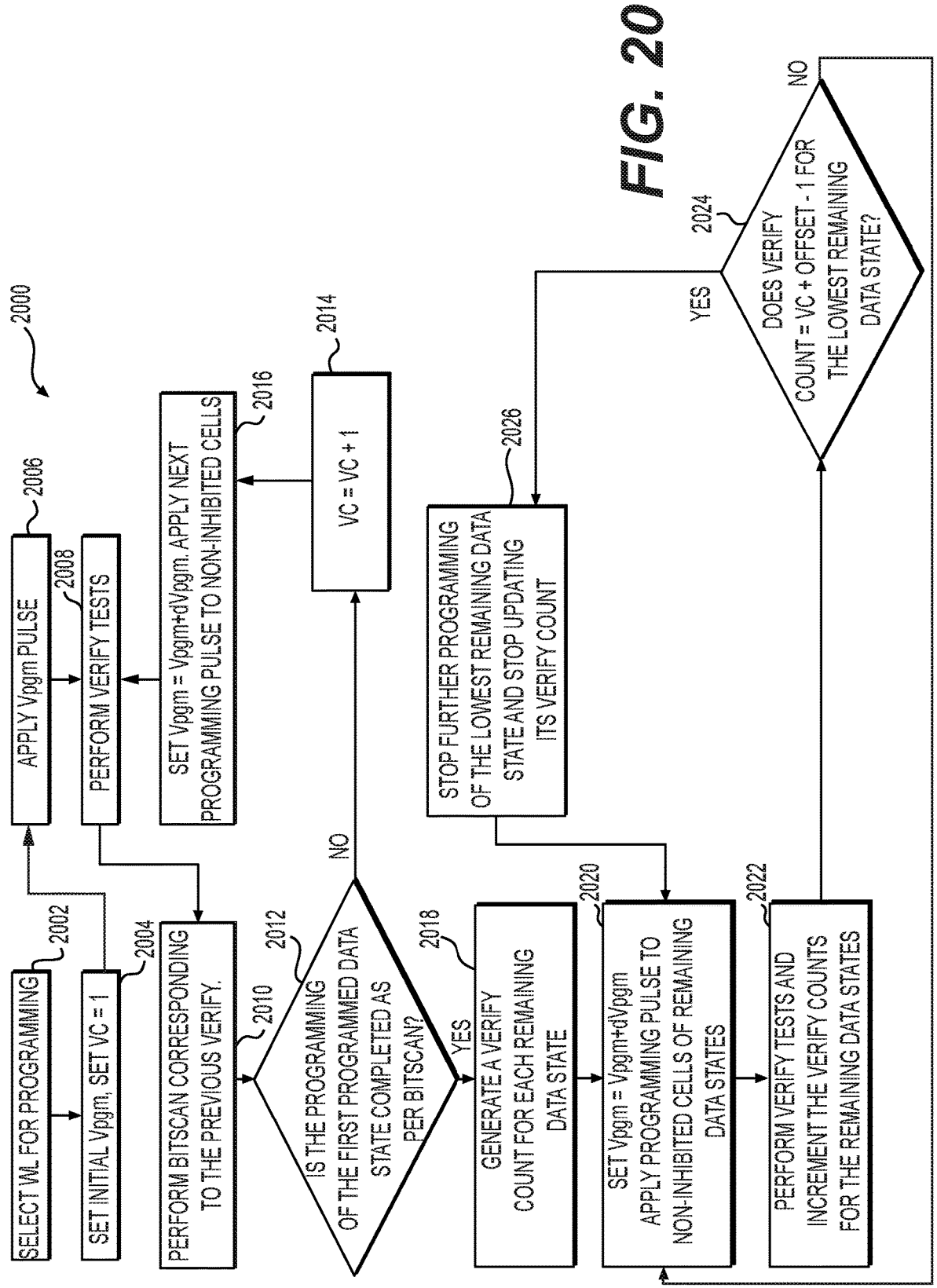
FIG. 20 is a flow chart illustrating an exemplary programming operation in a memory device.

FIG. 20 is a flow chart of an example process 2000 for programming memory cells. In an embodiment, the process 2000 may be performed by a control circuit in a memory device, such as the memory device 100 of FIG. 1.

At step 2002, a word line is selected for programming. In an embodiment, the selected word line is coupled to one or more memory cells. In an embodiment, each memory cell coupled to the selected word line states in an erase Er state prior to programming. In an embodiment, during programming, each memory cell coupled to the selected word line will be left in the Er state or programmed to one of multiple data states, such as the programmed data states S1-S15 of FIG. 11.

At step 2004, an initial programming voltage Vpgm is set, and a verify count VC is set at one. In an embodiment, the initial Vpgm may be set at between about 8 V and 30 V, although other values may be used. At step 2006, a Vpgm pulse is applied to the selected word line. As a result of applying the Vpgm pulse to the selected word line, one or more memory cells in the selected word line are shifted to a higher voltage thereby producing a threshold voltage distribution across the population of memory cells in the selected word line.

At step 2008, a verification signal (e.g., a waveform including one or more verify pulses) is applied to the selected word line while performing verify tests for one or more memory states. The verify tests determine if the threshold voltage of each memory cell has shifted above a verify voltage level associated with a first programmed data state, e.g., data state S1. In an embodiment, the verification signal may include multiple verify pulses corresponding to a plurality of data states, e.g., data states S1, S2, and S3.

At step 2010, a bitscan operation corresponding to the previous verify is performed. As described above, a bitscan operation includes counting the number of memory cells whose threshold voltage has not shifted above a particular verify voltage level (for example, Vv1L or Vv1 in FIGS. 12A and B) for a particular data state. For example, a data state S1 bitscan is a count of a number of memory cells being programmed to data state S1 whose threshold voltage has not shifted above verify voltage Vv1L if the programming operation is the first pass of the multi-pass programming operation shown in FIG. 12 or whose threshold voltage has not shifted above verify voltage Vv1 if the programming operation is the second pass of the same multi-pass operation. The result of the bitscan operation is compared to the bit ignore criteria to determine if programming of the memory cells being programmed to data state S1 is completed.

At step 2012, a determination is made whether programming of a first programmed data state is completed as per the bitscan. In one example, the first programmed data state is data state S1. In another embodiment where none of the memory cells of the selected word line are to be programmed to data state S1, then the first programmed data state may be data state S2, S3, etc. The determination that programming is completed could be made comparing the results of the bitscan operation to a predetermined bit ignore criteria.

If the determination at step 2012 is no (programming of the first programmed data state is not complete), then the method proceeds to step 2014. At step 2014, the verify count is indexed by one (VC=VC+1). The method then proceeds to step 2016. At step 2016, Vpgm is incrementally increased (Vpgm=Vpgm+dVpgm), and the next subsequent Vpgm pulse is applied to the uninhibited memory cells of the selected word line. The method returns to step 2008.

If the determination at step 2012 is yes (programming of the first programmed data state is completed), then then the verify count VC of the first programmed data state is fixed. For example, in one example, VC may be fixed at seven. Further programming of the memory cells at the first programmed data state is inhibited for the remainder of the programming operation, and the method proceeds to step 2018.

At step 2018, the controller generates a verify count for each remaining data state being programmed.

At step 2020, Vpgm is incrementally increased (Vpgm=Vpgm+dVpgm), and the next subsequent Vpgm pulse is applied to the uninhibited memory cells of the selected word line, i.e., the memory cells of the data states remaining to be programmed.

At step 2022, the verify tests are performed, and the verify counts for the remaining data states are incremented.

At step 2024, the database is referenced to determine the number of offset loops to use for the lowest remaining data state (e.g., see FIGS. 19A-C). A determination is then made if the verify count of the lowest remaining data state is equal to VC plus the offset minus one, i.e., does verify count=VC+Offset−1?

If the answer at step 2024 is yes, then the method proceeds to step 2026. At step 2026, programming of the memory cells to the lowest remaining data state is completed and updating of its verify count is halted, and further programming is inhibited for this data state for the remainder of the programming operation. Following this, the method returns to step 2020 to begin another program loop for the remaining data states. This cycle is repeated until the programming operation is completed for all data states being programmed.

If the answer at step 2024 is no, then the method returns to step 2020 to begin another program loop. This cycle is repeated until the programming operation is completed for all data states being programmed.

The process 2000 effectively reduces the number of verify pulses and the number of bitscan operations that are required to complete programming, thereby reducing programming time tprog and increasing the performance of the memory system with minimal or no reduction in programming quality. The process 2000 may also be employed either in a full sequence programming operation or as either or both passes in a multi-pass programming operation. When employed in both passes of a multi-pass programming operation, the reduction in total programming time may be approximately doubled as compared to when employed in a full sequence programming operation or in only one pass of a multi-pass programming operation.

The foregoing detailed description has been presented for purposes of illustration and description. It is not intended to be exhaustive or be limited to the precise form disclosed. Many modifications and variations are possible in light of the above description. The described embodiments were chosen to best explain the principles of the technology and its practical application to thereby enable others skilled in the art to best utilize the technology in various embodiments and with various modifications as are suited to the particular use contemplated. The scope of the technology is defined by the claims appended hereto.

What is claimed is:

1. A method of programming a memory apparatus, comprising the steps of:
    programming memory cells of a selected word line to a first programmed data state by conducting a plurality of programming loops until programming of the first programmed data state is completed, the programming loops including;
        applying a programming pulse to the selected word line,
        applying a verify pulse at a first verify voltage level to the selected word line, and
        conducting a bitscan operation after the verify pulse;
    determining a verify count being the number of verify pulses at the first verify voltage level performed to complete programming of the memory cells to the first programmed data state;
    programming memory cells to a second programmed data state that is at a higher voltage threshold than the first programmed data state by applying a plurality of programming pulses at increasing voltage levels and a plurality of verify pulses at a second verify voltage level to the selected word line; and
    wherein during programming of the memory cells to the second programmed data state, the number of verify pulses at the second verify voltage level is one fewer than the number of programming pulses.

2. The method as set forth in claim 1 wherein the number of programming pulses to complete programming of the memory cells to the second programmed data state is equal to the verify count and wherein the number of verify pulses at the second verify voltage level to complete programming of the memory cells to the second programmed data state is one fewer than the verify count.

3. The method as set forth in claim 1 wherein a number of programming pulses to complete programming of the memory cells to the second programmed data state is equal to the verify count plus a predetermined offset associated with the second programmed data state and wherein the number of verify pulses at the second verify voltage level that are performed during programming of the memory cells to the second programmed data state is equal to the verify count plus the predetermined offset that is associated with the second programmed data state minus one.

4. The method as set forth in claim 3 further including the step of programming memory cells to a third programmed data state that is at a higher voltage than the second programmed data state by applying to the selected word line a number of programming pulses and a number of verify pulses at a third verify voltage level, wherein the number of programming pulses is equal to the verify count plus a predetermined offset associated with the third programmed data state, and wherein the number of verify pulses at the third verify voltage level that are performed during programming of the memory cells to the third programmed data state is equal to the verify count plus the predetermined offset that is associated with the third programmed data state minus one.

5. The method as set forth in claim 4 wherein the predetermined offsets associated with the second and third programmed data states are based on a bit ignore criteria.

6. The method as set forth in claim 1 wherein during programming of the memory cells to the second programmed data state, bitscan operations are skipped.

7. The method as set forth in claim 1 wherein the first and second programmed data states are two of fifteen total programmed data states.

8. The method as set forth in claim 1 wherein the programming steps are a portion of one pass of a multi-pass programming operation.

9. The method as set forth in claim 8 wherein the programming steps are portions of both passes of a multi-pass programming operation.

10. An apparatus, comprising:
a word line including a plurality of memory cells that are able to be programmed to a plurality of data states;
a programming circuit configured to apply a plurality of programming pulses and a plurality of verify pulses to the memory cells during a programming operation;
during the programming operation, the programming circuit being configured to;
program memory cells of the word line to a first programmed data state by conducting a plurality of programming loops until programming of the first programmed data state is completed, the programming loops including;
applying a programming pulse to the word line, applying a verify pulse at a first verify voltage level to the word line, and conducting a bitscan operation after the verify pulse;
determine a verify count being the number of verify pulses at the first verify voltage level performed to complete programming of the memory cells to the first programmed data state,
program memory cells to a second programmed data state that is at a higher voltage threshold than the first programmed data state by applying a plurality of programming pulses at increasing voltage levels and a plurality of verify pulses at a second verify voltage level to the word line, and
wherein during programming of the memory cells to the second programmed data state, the number of verify pulses is one fewer than the number of programming pulses.

11. The apparatus as set forth in claim 10 wherein a number of programming pulses applied by the programming circuit to complete programming of the memory cells to the second programmed data state is equal to the verify count plus a predetermined offset associated with the second programmed data state and wherein the number of verify pulses at the second verify voltage level that are performed during programming of the memory cells to the second programmed data state is equal to the verify count plus the predetermined offset that is associated with the second programmed data state minus one.

12. The apparatus as set forth in claim 11 wherein each of the programmed data states includes a predetermined offset and wherein the predetermined offsets are based on a bit ignore criteria.

13. The apparatus as set forth in claim 11 wherein during programming of the memory cells to the second programmed data state, bitscan operations are skipped.

14. The apparatus as set forth in claim 11 wherein the first and second programmed data states are two of fifteen total programmed data states.

15. The apparatus as set forth in claim 11 wherein the programming operation is a portion of one pass of a multi-pass programming operation that the programming circuit is configured to perform.

16. The apparatus as set forth in claim 11 wherein the programming operation is a portion of both passes of a multi-pass programming operation that the programming circuit is configured to perform.

17. A memory system, comprising:
a word line including a plurality of memory cells that are able to be programmed to a plurality of data states;
a programming circuit configured to apply a plurality of programming pulses and a plurality of verify pulses to the memory cells of the word line and to perform bitscan operations during a programming operation;
during the programming operation, the programming circuit being configured to;
program memory cells to a first programmed data state by conducting a plurality of programming loops until programming of the first programmed data state is completed, the programming loops including programming pulses at sequentially increasing voltages and verify pulses at a first verify voltage level and bitscan operations that are conducted after the verify pulses,
determine a verify count being the number of verify pulses at the first verify voltage level performed to complete programming of the memory cells to the first programmed data state, and
program memory cells to a second programmed data state that is at a higher voltage threshold than the first programmed data state by conducting a plurality of programming loops, wherein the number of programming loops is no more than the verify count plus a predetermined offset and wherein a last one of the programming loops does not include a verify pulse and wherein bitscan operations are skipped during the programming of the memory cells to the second programmed data state.

18. The apparatus as set forth in claim 17 wherein each of the programmed data states includes a predetermined offset and wherein the predetermined offsets are based on a bit ignore criteria.

19. The apparatus as set forth in claim 17 wherein the programming operation is a portion of one pass of a multi-pass programming operation that the programming circuit is configured to perform.

20. The apparatus as set forth in claim 17 wherein the programming operation is a portion of both passes of a multi-pass programming operation that the programming circuit is configured to perform.

* * * * *